(12) United States Patent
Matsumura

(10) Patent No.: US 10,229,229 B2
(45) Date of Patent: Mar. 12, 2019

(54) DRIVING MODEL GENERATION DEVICE, DRIVING MODEL GENERATION METHOD, DRIVING EVALUATION DEVICE, DRIVING EVALUATION METHOD, AND DRIVING SUPPORT SYSTEM

(71) Applicant: Takeshi Matsumura, Choufu (JP)

(72) Inventor: Takeshi Matsumura, Choufu (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 354 days.

(21) Appl. No.: 14/372,333

(22) PCT Filed: Jan. 15, 2013

(86) PCT No.: PCT/JP2013/050577
§ 371 (c)(1),
(2) Date: Jul. 15, 2014

(87) PCT Pub. No.: WO2013/108752
PCT Pub. Date: Jul. 25, 2013

(65) Prior Publication Data
US 2015/0006132 A1    Jan. 1, 2015

(30) Foreign Application Priority Data
Jan. 20, 2012   (JP) ................................. 2012-010212

(51) Int. Cl.
*G06F 17/50* (2006.01)
*B60K 28/02* (2006.01)
(Continued)

(52) U.S. Cl.
CPC .......... *G06F 17/5009* (2013.01); *B60K 28/02* (2013.01); *G08G 1/0112* (2013.01);
(Continued)

(58) Field of Classification Search
CPC . B60W 2040/0863; B60W 230/18154; B60W 40/107
See application file for complete search history.

(56) References Cited

U.S. PATENT DOCUMENTS 6,205,374 B1 *   3/2001   Kljima et al. .................... 701/1
8,903,593 B1 * 12/2014   Addepalli et al. ........... 701/29.1
(Continued)

FOREIGN PATENT DOCUMENTS

JP   2004-306770   11/2004
JP   2006-199264   8/2006
(Continued)

OTHER PUBLICATIONS

International Search Report dated Mar. 19, 2013 in PCT/JP13/050577 filed Jan. 15, 2013.

*Primary Examiner* — Omar F Fernandez Rivas
*Assistant Examiner* — Robert S Brock
(74) *Attorney, Agent, or Firm* — Oblon, McClelland, Maier & Neustadt, L.L.P.

(57) ABSTRACT

A driving model generation device is provided that enables driving evaluation according to a traveling situation of a vehicle. A vehicle is provided with a vehicle state detector, which detects a vehicle state quantity that changes according to a driving operation by a driver. A model generator generates a driving model, which is a reference related to a specific driving operation, based on the vehicle state quantity at the time the driver starts the specific driving operation and the vehicle state quantity at the time the specific driving operation is finished. A driving evaluator evaluates the driving skill of the driver by comparing the driving operation of the driver presented by a detection result of the vehicle state detector to the driving model generated by the model generator.

19 Claims, 18 Drawing Sheets

(51) Int. Cl.
*B60W 40/09* (2012.01)
*B60W 50/00* (2006.01)
*G08G 1/01* (2006.01)
*G08G 1/095* (2006.01)
*G08G 1/0967* (2006.01)

(52) U.S. Cl.
CPC ......... *G08G 1/0129* (2013.01); *G08G 1/0145* (2013.01); *G08G 1/095* (2013.01); *G08G 1/096716* (2013.01); *G08G 1/096741* (2013.01); *G08G 1/096775* (2013.01); *G08G 1/096791* (2013.01); *B60W 40/09* (2013.01); *B60W 2050/0018* (2013.01); *B60W 2050/0029* (2013.01); *B60W 2540/28* (2013.01)

(56) References Cited

U.S. PATENT DOCUMENTS

| | | | |
|---|---|---|---|
| 2006/0293819 A1* | 12/2006 | Harumoto et al. | 701/41 |
| 2008/0281486 A1* | 11/2008 | Sakuma | 701/35 |
| 2010/0023223 A1* | 1/2010 | Huang et al. | 701/44 |
| 2010/0152950 A1* | 6/2010 | Chin et al. | 701/29 |
| 2010/0209881 A1* | 8/2010 | Lin et al. | 434/65 |
| 2010/0209889 A1* | 8/2010 | Huang et al. | 434/65 |
| 2010/0209890 A1* | 8/2010 | Huang et al. | 434/65 |
| 2011/0010052 A1* | 1/2011 | Limpibunterng et al. | 701/41 |
| 2011/0040447 A1* | 2/2011 | Horiuchi | 701/41 |
| 2013/0066611 A1 | 3/2013 | Yamada | |
| 2015/0168157 A1* | 6/2015 | Hoch | G01C 21/3469 701/400 |
| 2015/0336587 A1* | 11/2015 | Inoue | B62D 6/00 701/41 |
| 2018/0072310 A1* | 3/2018 | Fung | B60W 40/09 |

FOREIGN PATENT DOCUMENTS

| | | |
|---|---|---|
| JP | 2008-006994 | 1/2008 |
| JP | 2009-237937 | 10/2009 |
| JP | 2009-245149 | 10/2009 |
| JP | 2009-251814 | 10/2009 |
| JP | 2011-008699 | 1/2011 |
| WO | 2011/155030 | 12/2011 |

* cited by examiner

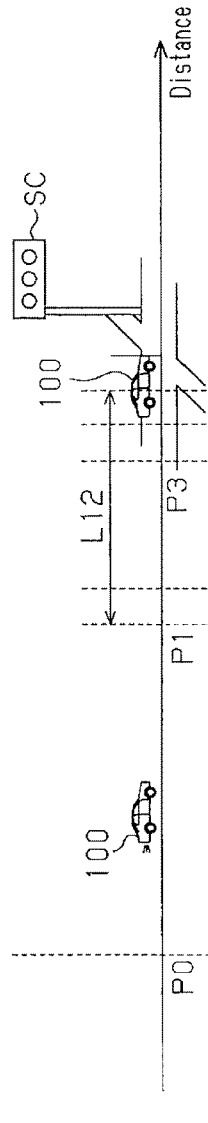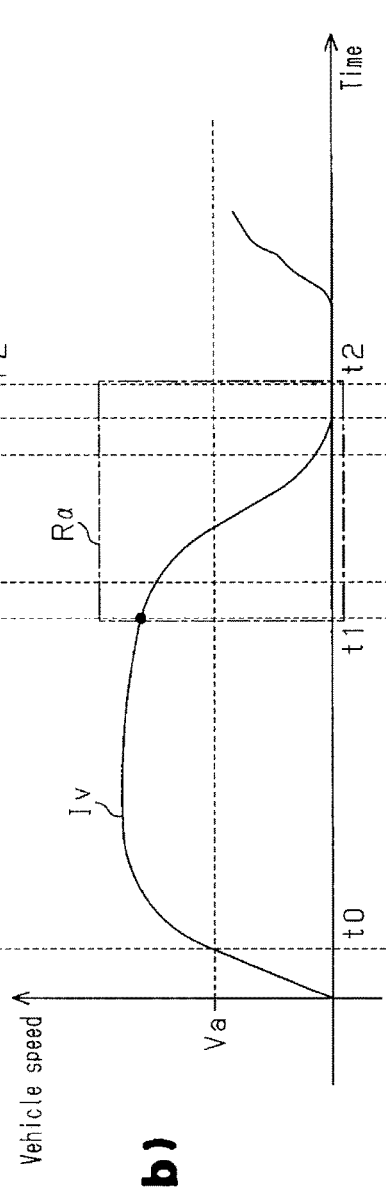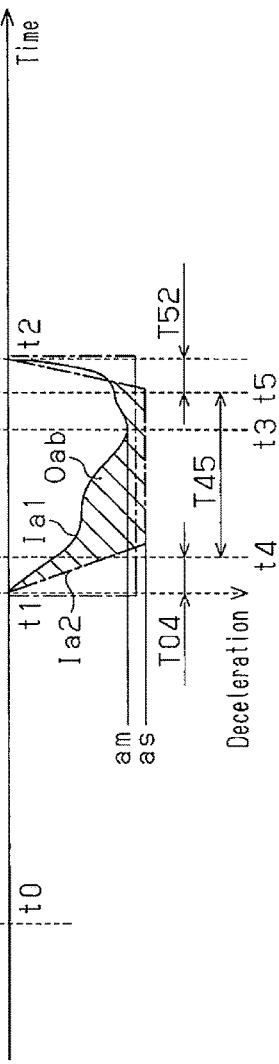

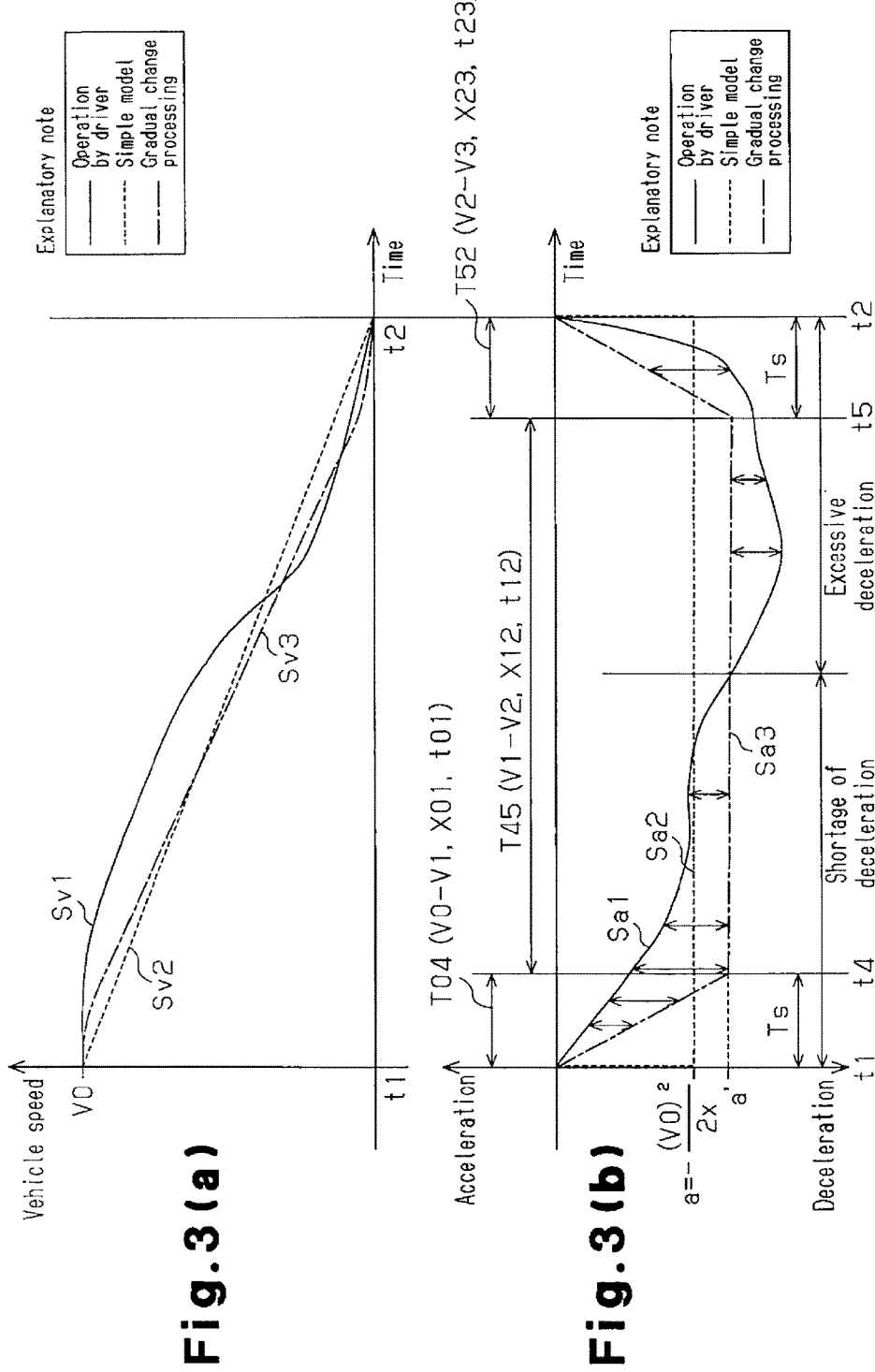

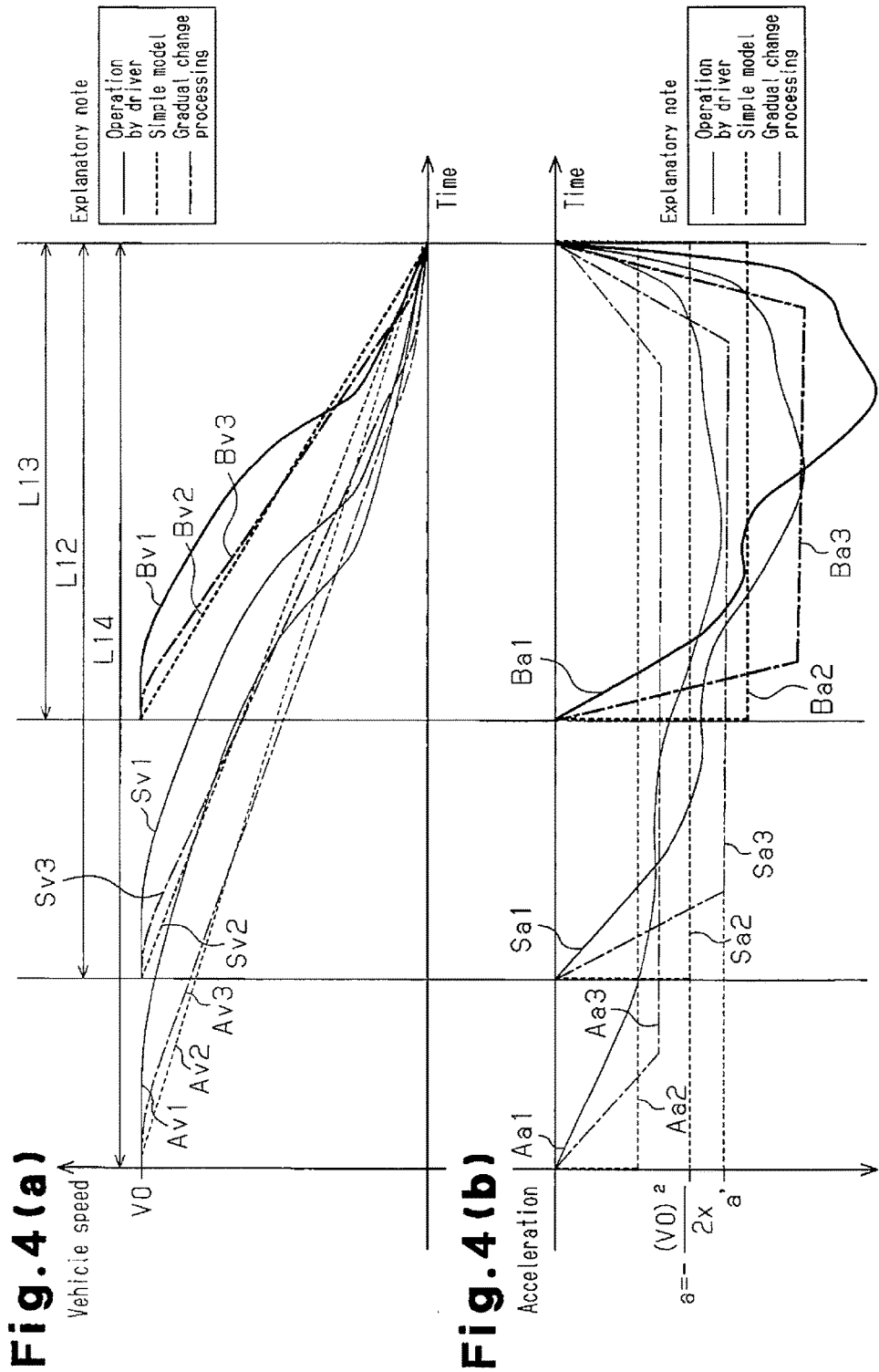

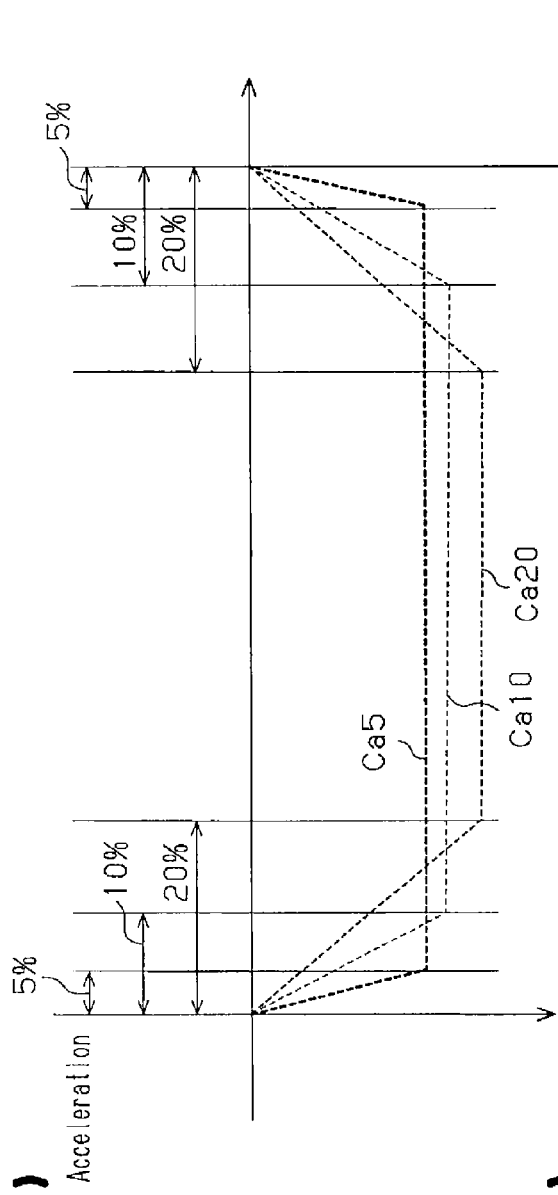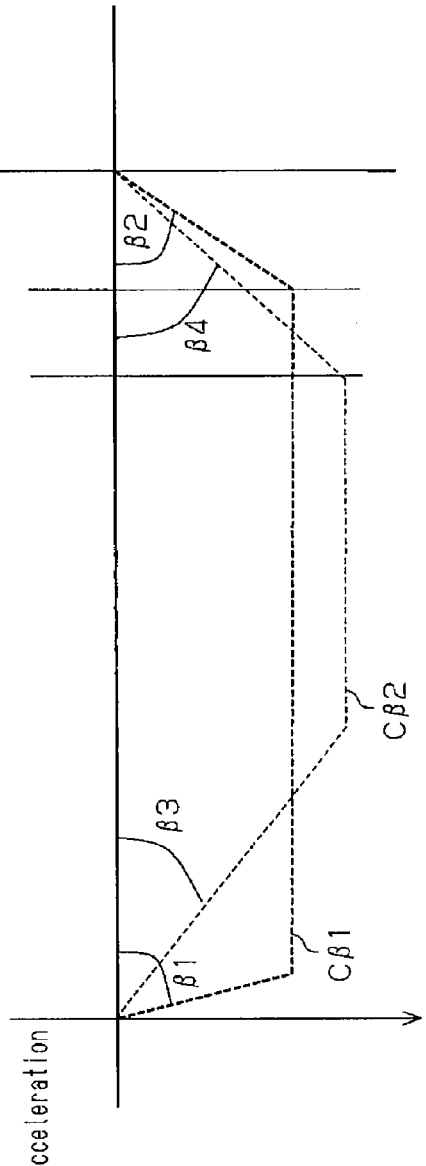
Fig.8(a)
Fig.8(b)

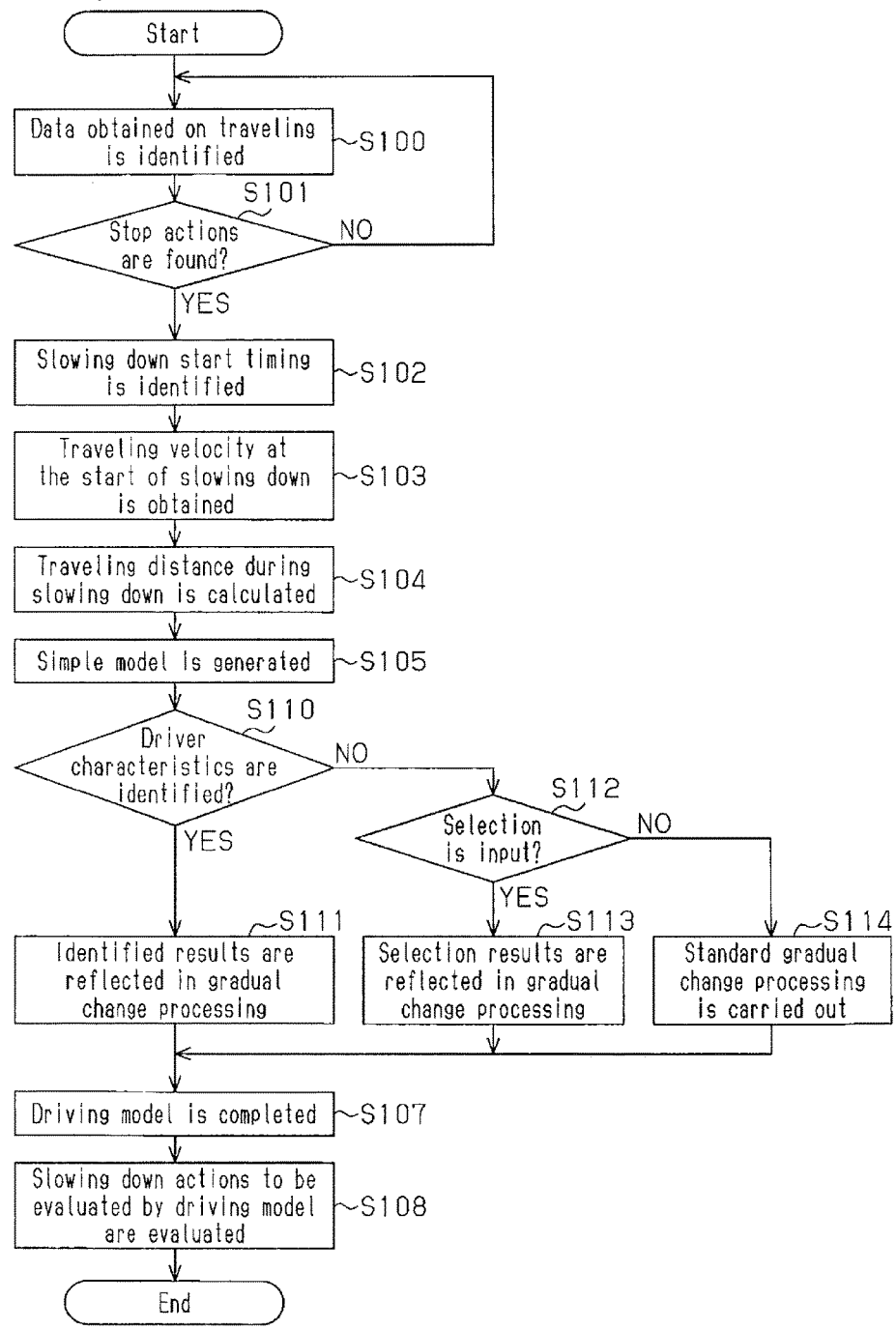

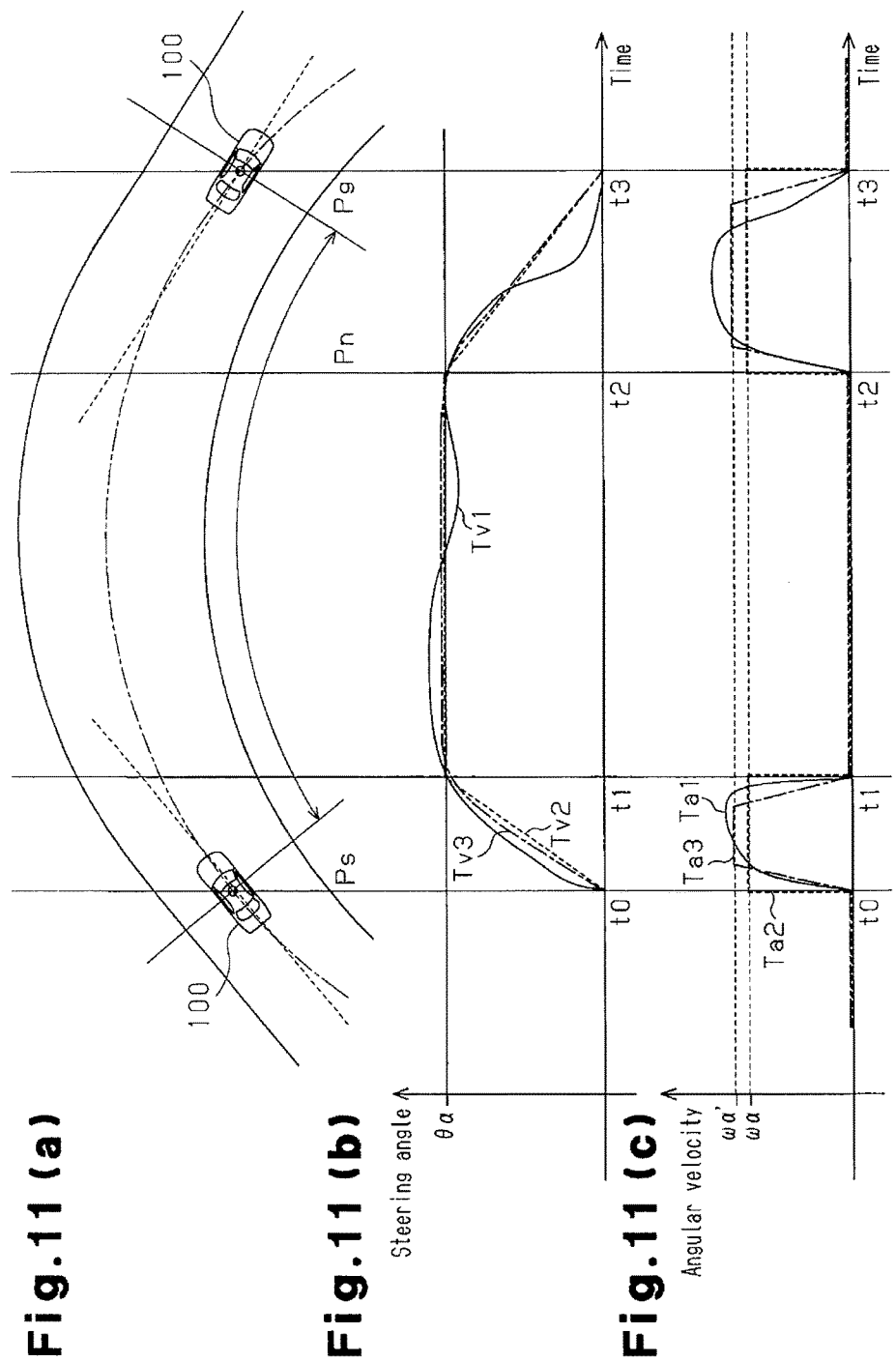

Fig.15

| | | Driver Da | Driver Db | Driver Dc | ... | Average value of all drivers | Total average value |
|---|---|---|---|---|---|---|---|
| At the time of slowing down | Site P1 (x, y) | Average value of slowing down actions ba1 | Average value of slowing down actions bb1 | Average value of slowing down actions bc1 | . | Site average value Pb1 | Average value of slowing down Pbx |
| | Site P2 | Average value of slowing down actions ba2 | Average value of slowing down actions bb2 | Average value of slowing down actions bc2 | . | Site average value Pb2 | |
| | Site P3 | Average value of slowing down actions ba3 | Average value of slowing down actions bb3 | Average value of slowing down actions bc3 | . | Site average value Pb3 | |
| | Site P4 | Average value of slowing down actions ba4 | Average value of slowing down actions bb4 | Average value of slowing down actions bc4 | . | Site average value Pb4 | |
| | Site P5 | Average value of slowing down actions ba5 | Average value of slowing down actions bb5 | Average value of slowing down actions bc5 | . | Site average value Pb5 | |
| | | Average value of driver Da | Average value of driver Db | Average value of driver Dc | | | |
| At the time of speeding up | Site P6 | Average value of speeding up actions ba6 | Average value of speeding up actions bb6 | Average value of speeding up actions bc6 | . | Site average value Pb6 | Speeding up average value Pby |
| | Site P7 | Average value of speeding up actions ba7 | Average value of speeding up actions bb7 | Average value of speeding up actions bc7 | . | Site average value Pb7 | |
| | Site P8 | Average value of speeding up actions ba8 | Average value of speeding up actions bb8 | Average value of speeding up actions bc8 | . | Site average value Pb8 | |
| | Site P9 | Average value of speeding up actions ba9 | Average value of speeding up actions bb9 | Average value of speeding up actions bc9 | . | Site average value Pb9 | |
| | Site P10 | Average value of speeding up actions ba10 | Average value of speeding up actions bb10 | Average value of speeding up actions bc10 | . | Site average value Pb10 | |
| | | Average value of driver Da | Average value of driver Db | Average value of driver Dc | | | |
| At the time of traveling on curve | Site P11 | Average value of curve actions ba11 | Average value of curve actions bb11 | Average value of curve actions bc11 | . | Site average value Pb11 | Curve average value Pbz |
| | Site P12 | Average value of curve actions ba12 | Average value of curve actions bb12 | Average value of curve actions bc12 | . | Site average value Pb12 | |
| | | Average value of driver Da | Average value of driver Db | Average value of driver Dc | . | | |

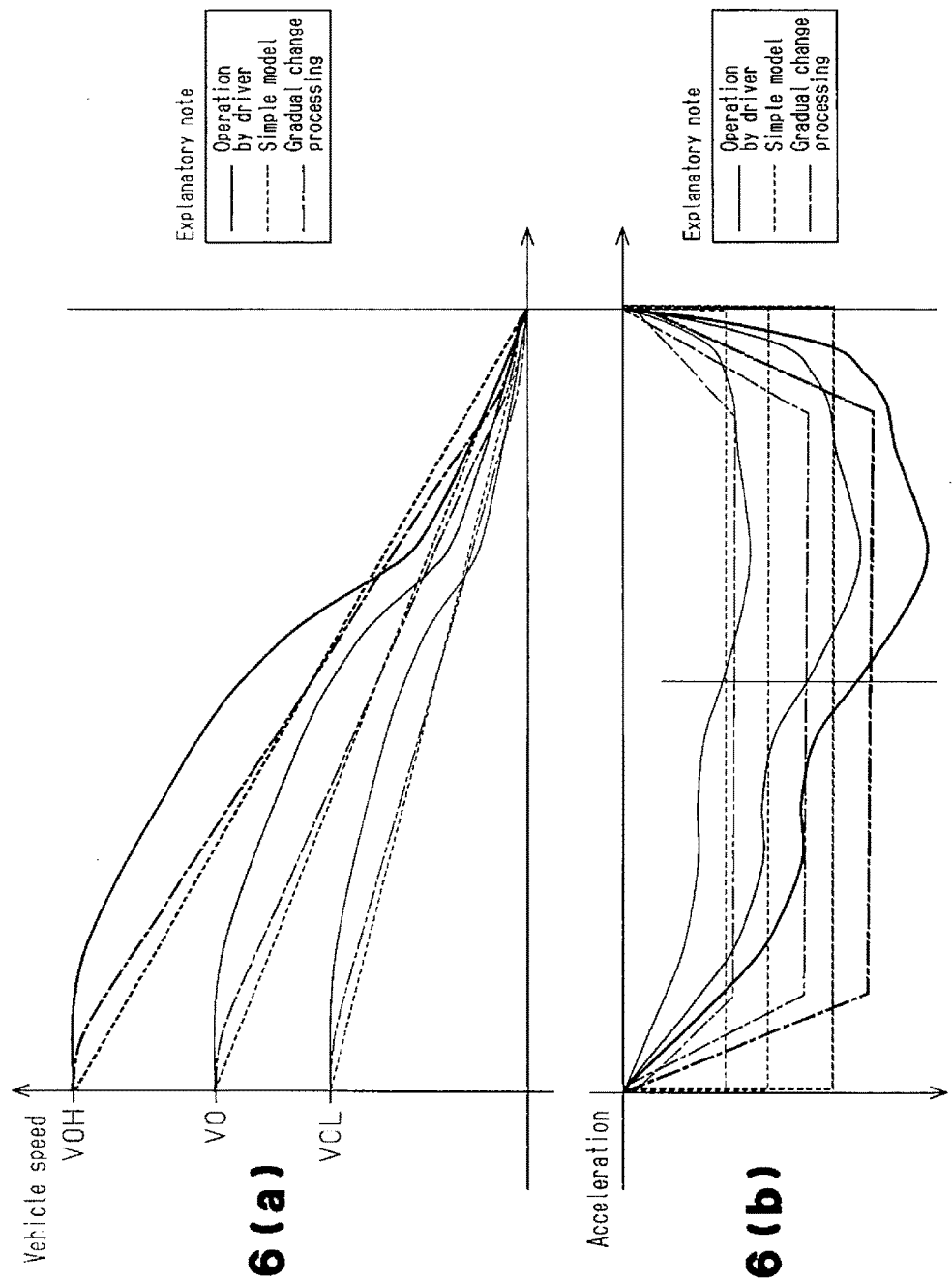

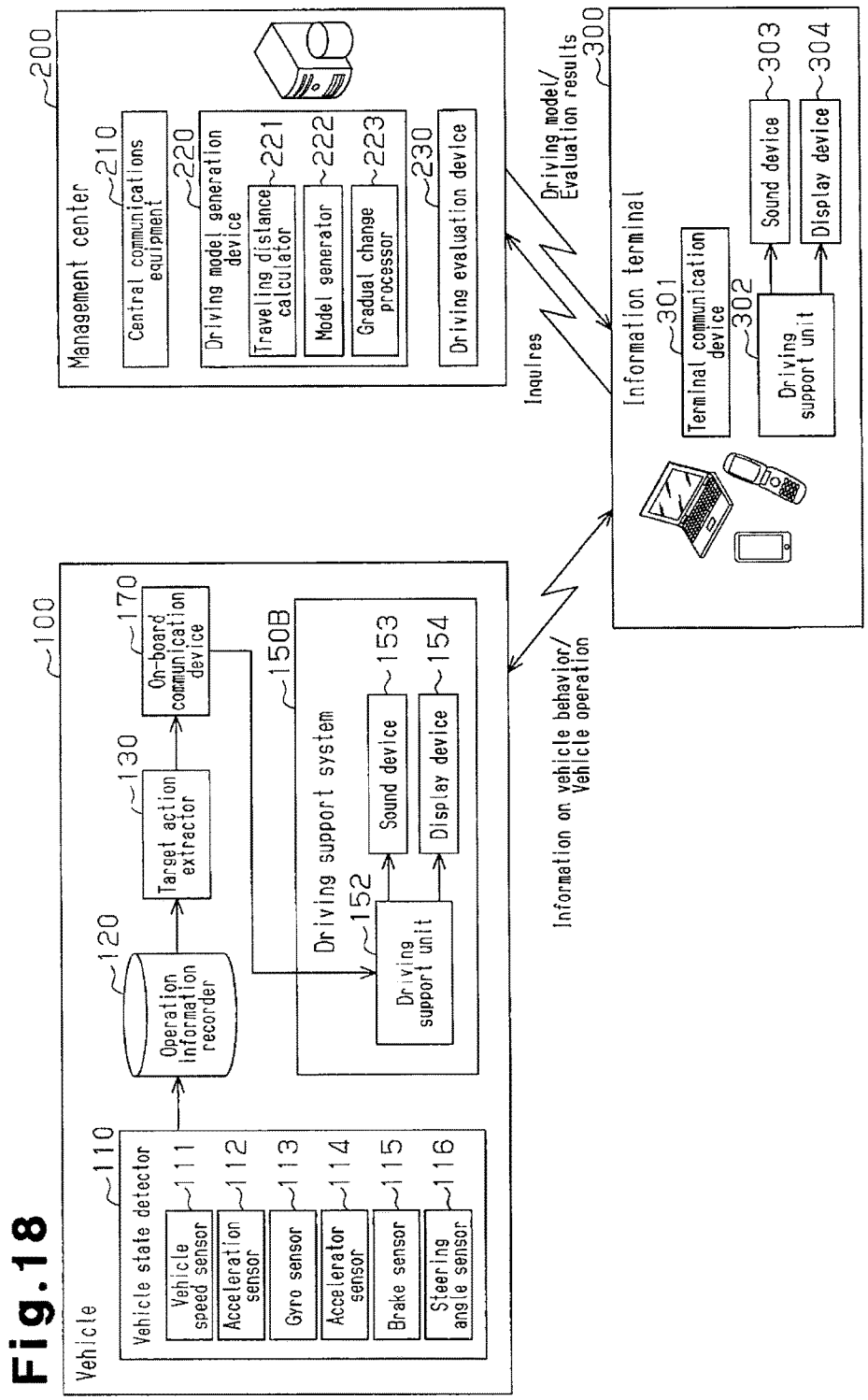

DRIVING MODEL GENERATION DEVICE, DRIVING MODEL GENERATION METHOD, DRIVING EVALUATION DEVICE, DRIVING EVALUATION METHOD, AND DRIVING SUPPORT SYSTEM

FIELD OF THE DISCLOSURE

The present disclosure relates to a driving model generation device that is useful in evaluation of driving skill of a driver who drives a vehicle. The present disclosure also relates to a driving model generation method. Further, the present disclosure relates to a driving evaluation device using a driving model generated by the driving model generation method, a driving evaluation method and a driving support system.

BACKGROUND OF THE DISCLOSURE

In general, a driving support system for supporting the driving of vehicles uses an on-board camera and a navigation system to obtain traffic information on a street crossing, a stop position, a curve and approach of vehicles ahead, which require control of slowing down of vehicles. On the basis of the thus obtained traffic information on the vicinity of vehicles, guidance for slowing down by sound is given or a braking force is applied practically in a semi-compulsory manner to provide slowing down support, thereby giving driving support to a driver.

In recent years, such a system has been under development that operation of various types of driving components such as an accelerator pedal, a brake pedal and a steering of a vehicle operated by a driver are detected and the thus detected operation are analyzed to make an objective evaluation of the driving skill of the driver. The above described system has been disclosed, for example, in Patent Document 1, which evaluates the driving skill of a driver on the basis of deceleration of a vehicle detected by a vehicle speed sensor mounted on the vehicle.

In the system disclosed in Patent Document 1, a vehicle is, first, detected for deceleration on the basis of a predetermined measurement cycle. Thus, the amount of change in the thus detected deceleration in the measurement cycle is determined and the maximum deceleration in the measurement cycle is identified. A correlation between the amount of change in the deceleration and the maximum deceleration is determined by statistical processing, for example, regression analysis. The thus determined correlation is defined as measurement characteristics that show slowing down characteristics of a driver who drives a vehicle. The thus defined measurement characteristics are used for evaluating the driving skill of the driver on the basis of an extent of variability thereof.

As described above, according to the system of Patent Document 1, evaluation is made for the safety of vehicle operation by the driver on the basis of an extent of variability in correlation between the amount of change in deceleration and the maximum deceleration in a measurement cycle.

PRIOR ART DOCUMENT

Patent Document

Patent Document 1: Japanese Laid-Open Patent Publication No. 2004-306770

SUMMARY OF THE INVENTION

Problems that the Invention is to Solve

Incidentally, even if there is found, for example, variability in correlation between an amount of change in deceleration and a maximum deceleration, there is a situation where such driving that causes measurement characteristics to vary will be inevitable, with traveling environments of vehicles taken into account. For example, when a driver drives a vehicle toward a street crossing equipped with a traffic light indicating green and the traffic light turns from green to yellow and then to red, the driver who operates the vehicle at an ordinary traveling velocity is forced to perform a more abrupt braking operation than usual. In view of variability in measurement characteristics and fuel consumption, for example, the abrupt braking operation may be evaluated to be low in driving skill. Alternatively, even if slow braking operation high in economic efficiency is performed, this braking operation is not necessarily an operation appropriate for a certain situation at the time of traveling of a vehicle. That is, even in the above described case of the abrupt braking operation, for example, when a vehicle in a traveling state can be kept stopped stably, this is to be evaluated as driving high in driving skill. Where evaluation is made for driving skill only in view of variability in measurement characteristics and fuel consumption, the evaluation is not always a correct evaluation for covering all the situations at the time of traveling of a vehicle.

As described above, an appropriate evaluation for various types of driving operation including the slowing down operation still leaves room for improvement in terms of an evaluation devices and an evaluation method thereof.

The present disclosure is to provide a driving model generation device and a driving model generation method capable of evaluating driving in compliance with traveling situations of a vehicle, a driving evaluation device and a driving evaluation method as well as a driving support system that uses the driving model.

Means for Solving the Problems

Hereinafter, a description will be given of means for solving the above described problems and effects thereof.

In accordance with one aspect of the present disclosure, a driving model generation device is provided that generates a driving model on the basis of driving operation of a vehicle by a driver. The driving model generation device includes a state quantity detector that detects a vehicle state quantity that changes according to driving operation by the driver, and a model generator that, on the basis of the vehicle state quantity when the driver starts a specific driving operation and the vehicle state quantity when the driver ends the specific driving operation, generates a driving model to be used as a reference related to the specific driving operation.

In accordance with another aspect of the present disclosure, a driving model generation method for generating a driving model on the basis of driving operation of a vehicle by a driver is provided. The driving model generation method includes: detecting a vehicle state quantity that changes according to the driving operation by the driver; and generating a driving model to be used as a reference related to specific driving operation on the basis of the vehicle state quantity when the driver starts the specific driving operation and the vehicle state quantity when the driver ends the specific driving operation.

Upon a certain driving operation performed by a driver who drives a vehicle, a vehicle state quantity will vary according to the driving operation thereof. Usually, the driver performs the driving operation in order to shift a vehicle state quantity at the time of starting the driving operation to a vehicle state quantity at the end of the driving operation. However, even if a vehicle state quantity at the end of a certain driving operation can be shifted to a target state, all the driving operation performed from the start of the certain driving operation to the end thereof is not necessarily driving operation appropriate for shifting a vehicle state quantity at the start to a vehicle state quantity when the vehicle is stopped. On the other hand, if a target vehicle state quantity in performing a certain driving operation, in other words, a vehicle state quantity at the end of a certain driving operation and a vehicle state quantity at the start of the driving operation are understood, it is possible to induce driving operation for allowing a vehicle state quantity to change by referring to these state quantities of the vehicle.

Therefore, as described in the above configuration or the method, on the basis of a vehicle state quantity at the start of the driving operation and a vehicle state quantity at the end thereof upon performance of specific driving operation, a driving model is generated for a traveling zone where the driving has been performed. As a result, a driving model is generated appropriate for shifting a first vehicle state quantity to a last vehicle state quantity as a target in the traveling zone where the vehicle has traveled. The thus generated driving model shows a driving operation mode for shifting the first vehicle state quantity to the target last vehicle state quantity. Therefore, the first vehicle state quantity, that is, the vehicle state quantity when a necessity for the specific driving operation arises is taken into consideration. Accordingly, the above generated driving model is to reflect the first vehicle state quantity and the target last vehicle state quantity, resulting in generation of a driving model dealing with each situation.

According to the above described configuration or the method, it is sufficient to understand only the first vehicle state quantity and the target last vehicle state quantity. Thus, it is not necessary to understand traveling environments when specific driving operation has been performed, for example, the change in color of a traffic light ahead in a direction in which the vehicle moves and which is responsible for causing hard braking. Therefore, it is possible to generate a driving model without detection of traveling environments of a vehicle and also to generate the driving model more easily. If a vehicle state quantity at the start and a vehicle state quantity at the end are common or similar to each other, it is possible to apply the above generated driving model, although the traveling environments are different from each other. It is, thus, possible to generate driving models in a larger number of situations and also to utilize the thus generated driving models more frequently without depending on traveling environments of the vehicle to which the above described driving model is to be applied.

In accordance with one form of the disclosure, the vehicle state quantity includes a movement distance or movement time of the vehicle from the start of the specific driving operation to the end thereof and an amount of change in vehicle behavior from the start of the driving operation to the end thereof, and the model generator is configured to generate as the driving model a model that shows changes over time in vehicle behavior from the start of the driving operation to the end thereof.

In accordance with one form of the disclosure, the generation method further includes selecting, as the vehicle state quantity, a movement distance or movement time of a vehicle from the start of the specific driving operation to the end thereof and an amount of change in vehicle behavior from the start of the driving operation to the end thereof. Generation of the driving model includes generating as the driving model a model that shows change over time in vehicle behavior from the start of the driving operation to the end thereof.

A vehicle state quantity includes roughly a movement distance of a vehicle from the start of specific driving operation to the end thereof, traveling time from the start of specific driving operation to the end thereof and vehicle behavior that changes dynamically according to driving. For example, on the basis of a movement distance of a vehicle during a period of time from the start of specific driving operation to the end thereof and vehicle behavior at the start of the period and at the end thereof, it is possible to generate a driving model that shows changes of vehicle behavior necessary for shifting the vehicle behavior in any given movement distance from a state at the start of specific driving operation to a state at the end thereof.

In order to change vehicle behavior to a target state in particular within a limited movement distance, there are cases in which a driver has to apply hard braking, make a sharp turn, or make an abrupt speeding up. In this respect, according to the above described configuration or the method, when a certain movement distance is given, a driving model is generated that shows changes of target vehicle behavior. Thus, it is possible to generate a target driving model in a situation where only a limited movement distance is allowed.

For example, on the basis of movement time required from the start of specific driving operation to the end thereof and vehicle behavior at the start of the period and at the end of the period, it is possible to generate a driving model that shows the changes of vehicle behavior necessary for shifting the vehicle behavior during the movement time given from a state at the start of the specific driving operation to a state at the end thereof.

In order to change in particular the vehicle behavior into a target state within a predetermined period of time, there are some cases in which require hard braking, sharp turn, abrupt speeding up and others. In this respect, according to the above described configuration or the method, it is possible to generate a driving model that shows the changes of vehicle behavior that are to be used as a reference when a certain movement time is given. It is, thus, possible to generate a driving model that is to be used as a reference in such a situation where only limited movement time is given.

In accordance with one form of the disclosure, the generation device further includes a gradual change processor that carries out gradual change processing, which is processing for decreasing a degree of change in vehicle behavior per unit time or per unit distance shown by the previously generated driving model.

In accordance with one form of the disclosure, the generation method further includes carrying out a gradual change, which is processing for decreasing the degree of change in vehicle behavior per unit time or per unit distance shown by a driving model generated on the basis of generation of the driving model.

When a driving model is generated only on the basis of a vehicle state quantity at the start of driving operation and a vehicle state quantity at the end thereof, of the vehicle behavior shown by the driving model, in particular, each of the vehicle state quantity at the start of driving operation and at the end thereof is changed to a great extent at the start of specific driving operation and at the end thereof. On the other hand, when a driver actually drives a vehicle, for example, when the driver starts to operate components of driving operation such as an accelerator pedal and a brake pedal or when the driver terminates to operate the components of driving operation, the components of driving operation are operated sequentially. Therefore, a vehicle state quantity that can be actually operated is to include what is called, time constants.

In this respect, according to the above described configuration or the method, the gradual change processor carries out processing for decreasing a degree of change in vehicle behavior per unit time or per unit distance shown by a driving model. As a result, the once generated driving model is changed to a model to which time constants are added. Thereby, it is possible to generate a model that is closer to driving operation artificially performed by a driver. Thus, the model can be used to make a more accurate driving evaluation.

In accordance with one form of the disclosure, the gradual change processor is configured to carry out at least one of the following processing as the gradual change processing: a. processing for decreasing the degree of change in vehicle behavior in a zone of specific percentage that includes a change in the vehicle behavior in an entire zone where specific driving operation has been performed; b. processing for decreasing the degree of change in vehicle behavior in a specific zone that includes at least one of the start point and the end point of the zone, in an entire zone where specific driving operation has been performed; c. processing for decreasing the degree of change in vehicle behavior in a zone where a vehicle has traveled during lapse of a predetermined period of time after the vehicle has gone through the start point of the zone, in an entire zone where specific driving operation has been performed; and d. processing for decreasing the degree of change in vehicle behavior in a zone where a vehicle has traveled during a predetermined period of time until the vehicle arrives at the end point of the zone, in an entire zone where specific driving operation has been performed.

In accordance with one form of the disclosure, the gradual change carries out at least one of the following: a. decreasing the degree of change in vehicle behavior in a zone of specific percentage that includes a change in the vehicle behavior in an entire zone where specific driving operation has been performed; b. decreasing the degree of change in vehicle behavior in a specific zone that includes at least one of the start point and the end point of the zone, in an entire zone where specific driving operation has been performed; c. decreasing the degree of change in vehicle behavior in a zone where a vehicle has traveled during lapse of a predetermined period of time after the vehicle has gone through the start point of the zone, in an entire zone where specific driving operation has been performed; and d. decreasing the degree of change in vehicle behavior in a zone where a vehicle has traveled during a predetermined period of time until the vehicle arrives at the end point of the zone, in an entire zone where specific driving operation has been performed.

The degree of change in vehicle behavior during which a vehicle in a traveling state, for example, is shifted to a stop state can be made slower accordingly as an arrival distance or arrival time at a target stop position is longer. In general, a driving model that is smaller in degree of change in vehicle behavior is closer to an ideal driving model. However, in such a situation where an arrival distance or arrival time at a target stop position is short, the degree of change in vehicle behavior is inevitably made greater. There is a case in which a driving model that has a great degree of change in vehicle behavior may be closer to an ideal driving model. A zone where the vehicle behavior will change is changed in proportion to a traveling zone. However, a percentage of the zone where the vehicle behavior will change in relation to an entire traveling zone tends to be constant, irrespective of whether the traveling zone is long or short.

In this respect, according to the above described configuration or the method, by means of the above described processing of a, gradual change processing is performed on a zone of specific percentage in relation to the entire traveling zone. Therefore, the degree of change in vehicle behavior of the driving model modified by the gradual change processing is automatically changed according to whether the traveling zone is long or short. Thus, when the traveling zone is long, the driving model is changed in a manner in which the vehicle behavior will change over a longer zone accordingly. On the other hand, when the traveling zone is short, the driving model is changed in a manner in which the vehicle behavior will change over a shorter zone accordingly. Thereby, even when the traveling zone has changed, gradual change processing is performed in compliance with the zone concerned.

The vehicle behavior tends to change in particular at the start of specific driving operation and at the end thereof. There is a particular increase in degree of change in vehicle behavior at the start point of the entire zone where specific driving operation has been performed and at the end point thereof. In this respect, according to the above described configuration and the method, processing is performed for decreasing the degree of change in vehicle behavior at least at one of a zone where a vehicle has traveled during lapse of a predetermined period of time after the vehicle has run through the start point of the zone and a zone where the vehicle has traveled during a predetermined period of time until the vehicle has arrived at the end edge of the zone, in the entire zone where specific driving operation has been performed by means of the above described processing of b. As a result, of vehicle behavior in a traveling zone where specific driving has been performed, the vehicle behavior which is in particular greatly changed is smoothed, and the driving model is modified to a model in compliance with actual driving.

Further, in a similar manner, by means of the above described processing of c, the degree of change in vehicle behavior is decreased in a zone where a vehicle has traveled during lapse of a predetermined period of time after the vehicle has run through the start point of the zone, in the entire zone where specific driving operation has been performed. Thereby, of vehicle behavior in a traveling zone where the specific driving operation has been performed, the vehicle behavior at the start point of the zone that is in particular greatly changed is smoothed on the basis of a traveling period of time, and the driving model is changed into a model in compliance with actual driving. Still further, by means of the above described processing of d, the degree of change in vehicle behavior is decreased in a zone where a vehicle has traveled during a predetermined period of time until the vehicle has arrived at the end point of the zone, in the entire zone where specific driving operation has been performed. Thereby, of vehicle behavior in a traveling zone where the specific driving operation has been performed, the vehicle behavior at the end point of the zone that is in particular greatly changed is smoothed on the basis of a traveling period of time, and the driving model is modified to a model in compliance with actual driving.

In accordance with one form of the disclosure, the gradual change processor is configured to modify a decreasing rate of the degree of change in the vehicle behavior according to a driving pattern of a driver to whom the above generated driving model is to be presented.

In accordance with one form of the disclosure, the gradual change includes modifying a decreasing rate of the degree of change in the vehicle behavior according to a driving pattern of a driver to whom a driving model generated by generation of the driving model is to be presented.

The degree of change in vehicle behavior upon certain driving tends to change by the driving skill of a driver and habit inherent in a driver. As a result, according to the above described configuration or the method, a driving model used in evaluating the driving skill of a driver and giving driving support is to be modified in accordance with vehicle behavior that will change according to the driving of a target driver, thus making it possible to modify the driving model to a model in compliance with the driving skills of the target driver and habits inherent in the driver. It is, thereby, possible to provide a driving model in compliance with the driving skill of the driver and habit inherent in the driver and also to provide a driving model that will match an intention of the driver.

In accordance with one form of the disclosure, the state quantity detector is configured to obtain information that shows state quantities of a plurality of vehicles on the basis of driving operation by a plurality of drivers as the vehicle state quantity. The gradual change processor is configured to use, as the amount of change in vehicle behavior at which the gradual change processing is carried out, at least one of the following: 11. an average value of amounts of change in vehicle behavior by the same driver; 12. an average value of amounts of change in vehicle behavior on the basis of driving operation by a plurality of drivers obtained at a specific site; and 13. an average value of amounts of change in vehicle behavior on the basis of driving operation by the same driver obtained at a specific site.

In accordance with one form of the disclosure, the detection of the vehicle state quantity includes obtaining information that shows state quantities of a plurality of vehicles on the basis of driving operation by a plurality of drivers as the vehicle state quantity. The gradual change uses, as an amount of change in a vehicle in which the gradual change is carried out, at least one of the following: 11. an average value of amounts of change in vehicle behavior by the same driver; 12. an average value of amounts of change in vehicle behavior on the basis of driving operation by a plurality of drivers obtained at a specific site; and 13. an average value of amounts of change in vehicle behavior on the basis of driving operation by the same driver obtained at a specific site.

In accordance with the above description of 11, as an amount of change in vehicle behavior on which gradual change processing is performed, an average value of amounts of change in vehicle behavior by the same driver can be used to give gradual change processing in compliance with a pattern of the driver. It is, thereby, possible to easily generate a model that will match desires of individual drivers.

In accordance with the above description of 12, as an amount of change in vehicle behavior on which gradual change processing is performed, an average value of amounts of change in vehicle behavior is used on the basis of driving of a plurality of drivers obtained at specific sites. Thereby, it is possible to generate a driving model that reflects the driving of each driver at a specific site and is high in versatility.

Further, in accordance with the above description of 13, as an amount of change in vehicle behavior on which gradual change processing is performed, there is used an average value of amounts of change in vehicle behavior on the basis of driving of the same driver obtained at a specific site. Thereby, it is possible to generate a driving model that reflects the driving routinely performed by a certain driver at a specific site. It is, thus, possible to generate a driving model that is higher in accuracy and in compliance with a driver and a traveling site.

In accordance with one form of the disclosure, the amount of change in vehicle behavior is composed of at least one of traveling velocity, deceleration, acceleration, jerk, and turning angle of the vehicle. The model generator is configured to generate a driving model of at least one of driving operation selected from the slowing down operation at the time of slowing down of the vehicle, the speeding up operation at the time of speeding up of the vehicle, and turning operation at the time of traveling on a curve or at the time of traveling on a street crossing.

In accordance with one form of the disclosure, the generation method further includes selecting at least one of traveling velocity, deceleration, acceleration, jerk, and turning angle of a vehicle as the amount of change in vehicle behavior. Generation of the driving model includes generating a driving model of at least one of driving operation selected from the slowing down operation at the time of slowing down of the vehicle, the speeding up operation at the time of speeding up of the vehicle, and turning operation at the time of traveling on a curve or at the time of traveling on a street crossing.

When a driver drives a vehicle to go into, for example, a street crossing and starts the vehicle at the street crossing, the driver performs the slowing down operation or the speeding up operation in order to stop the vehicle or start the vehicle in a stop state. In association with the above operation, the vehicle undergoes changes in traveling velocity, deceleration and acceleration. When the driver drives the vehicle on a curve or at a street crossing, the driver performs a turning operation for turning the vehicle, in addition to slowing down and speeding up of the vehicle. The slowing down operation, the speeding up operation and the turning operation will greatly influence fuel consumption, safety of traveling vehicle and travel time of a necessary zone.

In this respect, according to the above described configuration or the method, it is possible to generate a driving model of primary driving operation that is performed to change a vehicle state quantity when a vehicle is driven. The driving model of primary driving operation that influences the fuel consumption, the safety of traveling vehicle and the travel time of a necessary zone is used to evaluate the driving skill and give driving support. It is, thereby, possible to effectively improve components such as the fuel consumption, the safety of traveling vehicle and the travel time of a necessary zone.

In accordance with one form of the disclosure, the model generator is configured to be installed at a management center at which information showing the vehicle state quantity is aggregated. The model generator is configured to generate the driving model on the basis of the information showing the vehicle state quantity aggregated at the management center.

According to the above described configuration, information that shows a vehicle state quantity is aggregated at a management center. Also, a driving model is generated on the basis of the information that shows the vehicle state quantity aggregated at the management center. Therefore, it is possible to manage the information that shows the vehicle state quantity at the management center in a comprehensive manner. Further, the management center is allowed to exclusively generate a driving model using the information. Thereby, it is also possible to generate a driving model more smoothly and to generate various types of driving models on the basis of various pieces of information obtained by driving of a plurality of drivers.

According to the above described configuration, for example, a driving model generated by the management center is delivered to a navigation system mounted on a vehicle or a mobile information terminal device owned by a driver of the vehicle, by which the driving model can be provided to the driver and others through various means. Thereby, the thus generated driving model provides more applications. Further, according to the above described configuration, for example, information that shows a vehicle state quantity can be aggregated at the management center from vehicles by way of an information terminal including a smart phone that has a communications function. A driving model generated on the basis of the information aggregated at the management center can also be delivered to an information terminal. Thereby, the information terminal that already has a communications function can be used to aggregate information necessary for generating a driving model at the management center. Sources of collecting the information necessary for generating the driving model can be upgraded and expanded.

In accordance with another aspect of the present disclosure, a driving evaluation device is provided that evaluates driving of a vehicle by a driver. The driving evaluation device includes a driving evaluator that evaluates driving operation of the vehicle by the driver and an evaluation component detector that detects as an evaluation component a vehicle state quantity that changes according to driving operation by an evaluation-target driver. The driving evaluator is configured to compare a driving model generated by the above described generation device with the vehicle state quantity detected by the evaluation component detector, thereby evaluating the driving skill of the evaluation-target driver.

In accordance with another aspect of the present disclosure, a driving evaluation method for evaluating driving of a vehicle by a driver is provided. The driving evaluation method includes: evaluating driving operation of the vehicle by the driver; and detecting, as an evaluation component, a vehicle state quantity that changes according to driving operation by an evaluation-target driver. The evaluation of the driving operation includes comparing a driving model generated by the above described generation method with the vehicle state quantity detected by evaluation of the driving operation, thereby evaluating the driving skill of the evaluation-target driver.

The above described aspect is in particular effective in applying to evaluation of the driving skill of a driver. That is, according to the above described configuration or the method, irrespective of any situation when a vehicle is driven by an evaluation-target driver, a driving model generated on the basis of a vehicle state quantity obtained in a situation common or similar to the above described situation can be used to make evaluation. It is, therefore, possible to evaluate the driving skill of the driver with high accuracy through the evaluation made by using a driving model in compliance with each situation.

The driving support system provided from another aspect of the present disclosure is a driving support system for supporting driving operation performed by a driver of a vehicle. The above described driving support system is provided with a driving support unit that supports the vehicle driven by the driver on the basis of results of evaluation made by the driving evaluation device. Thus, the driving support unit is configured such that the driving operation performed by the evaluation-target driver of the vehicle is guided into driving operation in compliance with the above described driving model by way of at least one of voice guidance, image guidance and guidance by vehicle control by means of a sound device, a display device and a vehicle driving system mounted on the vehicle.

The above described configuration is in particular effective in applying to a system that uses the thus generated driving model to give various types of driving support. That is, according to the above described configuration, the voice guidance, the image guidance and the vehicle control are provided by a mode that guides driving operation performed by the evaluation-target driver into the driving operation according to the above generated driving model. Thereby, it is possible to guide the driving operation performed by the driver into driving operation that is given as a reference in each situation.

BRIEF DESCRIPTION OF THE DRAWINGS

FIG. 2(a) is a diagram showing one example of a traveling route on which a signalized street crossing is provided;

FIG. 2(b) is a time chart showing an example of changes in traveling velocity of a vehicle that has traveled on the traveling route of FIG. 2(a);

FIG. 2(c) is a time chart showing an example of changes in deceleration of the vehicle, which has traveled on the traveling route of FIG. 2(a);

FIG. 3(a) is a diagram showing one example of a driving model of traveling velocity at the time of slowing down actions of a vehicle;

FIG. 3(b) is a diagram showing one example of a driving model of deceleration at the time of slowing down actions of the vehicle;

FIG. 4(a) is a diagram showing one example of a driving model of traveling velocity at the time of slowing down actions of a vehicle for each movement distance of the vehicle;

FIG. 4(b) is a diagram showing one example of a driving model of deceleration at the time of slowing down actions of the vehicle for each movement distance of the vehicle;

FIG. 8(a) is a diagram showing one example of a driving model of traveling velocity at the time of slowing down actions of a vehicle for each percentage of setting of a time constant;

FIG. 8(b) is a diagram showing one example of a driving model of deceleration at the time of slowing down actions of the vehicle for each percentage of setting of a time constant;

FIG. 9 is a flowchart showing one example of a gradual change processing procedure of the driving model given in the embodiment of FIG. 6;

FIG. 11(a) is a diagram showing one example of a traveling route in which a vehicle has taken actions on a curve;

FIG. 11(b) is a diagram showing one example of the driving model of a steering angle when the vehicle has taken actions on a curve;

FIG. 11(c) is a diagram showing one example of the driving model of a steering angular velocity when the vehicle has taken actions on a curve;

FIG. 15 is a diagram showing average values of slowing down actions, speeding up actions and actions taken on a curve by a vehicle that are reflected in the gradual change processing given in the embodiment of FIG. 14 at each site and for each driver;

FIG. 16(a) is a diagram showing one example of a driving model of traveling velocity at the time of slowing down actions of a vehicle in a driving model generation device, a driving model generation method, a driving evaluation device, a driving evaluation method, and a driving support system of a modification for each traveling velocity at the start of the slowing down operation;

FIG. 16(b) is a diagram showing one example of a driving model of deceleration at the time of slowing down actions of a vehicle at each traveling velocity at the start of the slowing down operation;

FIG. 18 is a block diagram showing a vehicle, a management center and an information terminal to which applied are a driving model generation device, a driving model generation method, a driving evaluation device, a driving evaluation method and a driving support system of further still another modification.

DETAILED DESCRIPTION OF THE PREFERRED EMBODIMENTS

First Embodiment

A driving model generation device, a driving model generation method, a driving evaluation device, a driving evaluation method, and a driving support system according to a first embodiment of the present disclosure will be described with reference to FIGS. 1 to 5.

Figure 1:
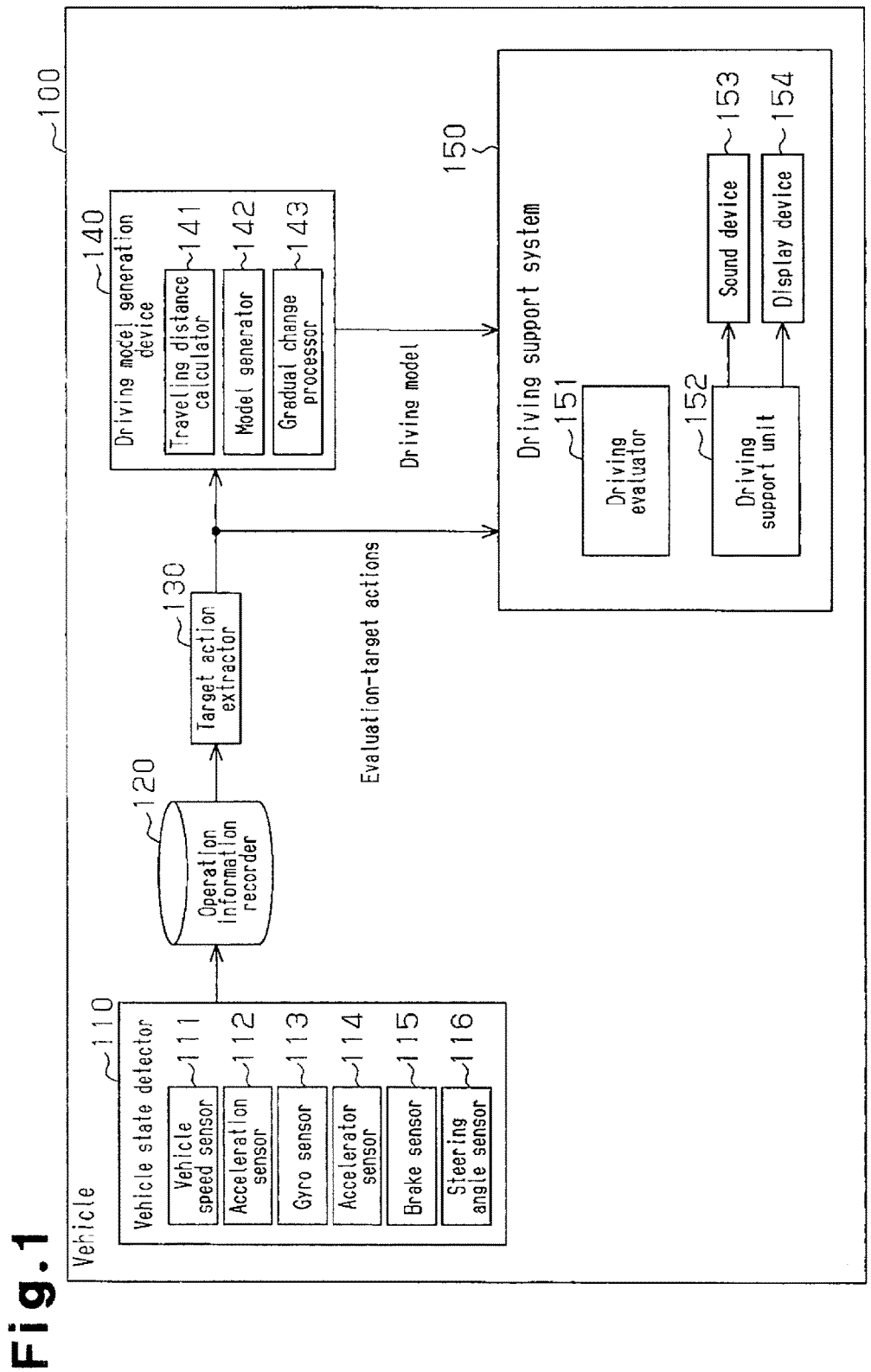
FIG. 1 is a block diagram of a vehicle to which applied are a driving model generation device, a driving model generation method, a driving evaluation device, a driving evaluation method and a driving support system according to a first embodiment.

As shown in FIG. 1, a vehicle 100 to which applied are the driving model generation device, the driving model generation method, the driving evaluation device, the driving evaluation method and the driving support system of the present embodiment is provided with a vehicle state detector 110, which detects a state quantity of the vehicle 100.

The vehicle state detector 110 is composed of a vehicle speed sensor 111, an acceleration sensor 112, a gyro sensor 113, an accelerator sensor 114, a brake sensor 115, a steering angle sensor 116 and others. These various types of sensors 111 to 116 are electrically connected to an operation information recorder 120, which aggregates results detected by the various sensors via an on-board network, for example, a control area network (CAN). In the present embodiment, the above described state quantity detector and the evaluation component detector are configured by the vehicle state detector 110.

The vehicle speed sensor 111 detects a wheel rotation speed and outputs a signal according to the thus detected rotation speed to the operation information recorder 120. The acceleration sensor 112 detects acceleration of the vehicle 100 and outputs a signal according to the thus detected acceleration to the operation information recorder 120. The gyro sensor 113 detects an angle and an angular velocity of the vehicle 100 on traveling and outputs signals according to the thus detected angle and the angular velocity to the operation information recorder 120. The accelerator sensor 114 detects an accelerator position, which is changed by an accelerator pedal operated by a driver and outputs a signal according to the thus detected accelerator position to the operation information recorder 120. The brake sensor 115 detects whether a brake pedal has been operated by the driver or not and outputs a signal according to whether the brake pedal has been operated or not to the operation information recorder 120. The steering angle sensor 116 detects an amount of change in steering angle. The steering angle sensor 116 calculates a steering angle on the basis of the thus detected amount of change in steering angle and outputs a signal according to the calculated steering angle to the operation information recorder 120.

The operation information recorder 120 sequentially records signals input from the various sensors 111 to 116 as data that shows a state quantity of the vehicle 100. Thereby, the operation information recorder 120 accumulates vehicle behavior data that shows changes in vehicle speed, acceleration and deceleration that change according to driving of the vehicle 100 by a driver as well as vehicle operation data that shows operation of the accelerator pedal, the brake pedal and the steering.

On the vehicle 100 of the present embodiment, there is mounted a target action extractor 130, which extracts target actions for generating a driving model from data accumulated in the operation information recorder 120. The target action extractor 130 extracts data that shows specific driving operation, for example, data that shows the slowing down operation performed by a driver, data that shows the speeding up operation, and data that shows steering operation from the data accumulated in the operation information recorder 120 under predetermined conditions. The target action extractor 130 outputs the thus extracted data to a driving model generation device 140, which generates a driving model on the basis of the above described data.

The driving model generation device 140 is provided with a traveling distance calculator 141, which calculates a traveling distance of the vehicle 100 on specific driving operation on the basis of the data input from the operation information recorder 120. The driving model generation device 140 is provided with a model generator 142 for generating a simple model, which is a simple driving model to be used as a reference in a situation where the specific driving operation has been performed and a gradual change processor 143 for carrying out gradual change processing, which brings the simple model generated by the model generator 142 closer to driving operation actually performed by a driver.

The traveling distance calculator 141 conducts a predetermined computation on the basis of, for example, data showing results detected by the vehicle speed sensor 111, of the data input from the target action extractor 130, thereby calculating a traveling distance of the vehicle 100. The traveling distance calculator 141 of the present embodiment calculates the traveling distance by using, as a unit, specific driving operation such as one slowing down operation, one speeding up operation and one braking operation performed for one traffic component in the traveling distance. Thereby, in the present embodiment, upon each performance of the specific driving operation, calculation is made for the traveling distance of the vehicle 100 during a period of time when the driving operation has been performed.

The model generator 142 of the present embodiment generates a driving model, using vehicle behavior data that shows behavior of the vehicle 100 such as a traveling velocity, acceleration, and an advancing angle of the vehicle 100 as well as vehicle operation data that shows operation modes of an accelerator pedal, a brake pedal and a steering of the vehicle 100, of the data extracted by the target action extractor 130. Upon generation of the driving model, the model generator 142 of the present embodiment obtains a traveling distance of the vehicle 100 when the specific vehicle operation shown by the vehicle operation data has been performed from calculation results of the traveling distance calculator 141 and uses the thus obtained traveling distance. In the present embodiment, when, for example, a traveling distance calculated by the traveling distance calculator 141, in other words, a movement distance of the vehicle 100 is given, there is generated as a driving model a model that shows changes in vehicle behavior such as vehicle speed and deceleration for shifting the vehicle 100, for example, from a traveling state to a stop state within the movement distance. In the present embodiment, the driving model is generated for each specific driving operation extracted by the target action extractor 130 such as the slowing down operation, the speeding up operation and steering operation performed by a driver. When there is a difference in movement distance of the vehicle 100 from a state of traveling at a predetermined traveling velocity to a stop state although by the same slowing down operation, a driving model generated on the basis of vehicle behavior data of the vehicle 100 and a driving model generated on the oasis of vehicle operation data thereof are different from each other. That is, in the present embodiment, under a circumstance in which the distance up to a stop position is short and hard braking is required, in other words, when the slowing down operation has been performed in a situation where a movement distance is short, there is generated a driving model for shifting the vehicle 100 from a traveling state to a stop state within a short movement distance. In contrast, under a circumstance in which the distance up to the stop position is sufficiently secured and the vehicle can be reduced in speed slowly, in other words, when the slowing down operation has been performed in a situation where a movement distance is sufficiently long, there is generated a driving model for shifting the vehicle 100 from a traveling state to a stop state within a sufficiently long movement distance. Each of the above described driving models is generated as a driving model that can be used as a reference in each situation. That is, even a driving model that includes hard braking will be used as a reference driving model in the above described situation under a circumstance in which hard braking is required, with the above described situation taken into account.

On the other hand, the gradual change processor 143 of the present embodiment gives processing for decreasing the degree of change in vehicle behavior shown by the driving model to the driving model generated by the model generator 142. Thereby, changes in vehicle behavior such as vehicle speed and deceleration shown by the driving model is made smooth. That is, the driving model is changed to a driving model which is highly reproducible by a driver.

The driving model generation device 140 outputs a driving model that is generated by the model generator 142 and on which gradual change processing is performed by the gradual change processor 143 to a driving support system 150, which gives various types of driving support on the basis of the above described driving models.

The driving support system 150 is composed of a driving evaluator 151, which uses the driving model generated by the driving model generation device 140 to evaluate the driving skill of a driver of the vehicle 100 and a driving support unit 152, which uses the above described driving model to give the driving support to the driver. In the present embodiment, the above described driving evaluation device is composed of the vehicle state detector 110 and the driving evaluator 151.

Of the above described units, the driving evaluator 151 obtains data showing the specific driving operation to be evaluated from the target action extractor 130. Thereby, vehicle behavior data and vehicle operation data upon performance of specific operation such as the slowing down operation, the speeding up operation or steering operation are obtained from the target action extractor 130. The driving evaluator 151 obtains a driving model generated so as to be in compliance with evaluation-target driving operation from the driving model generation device 140. The driving evaluator 151 compares the driving model obtained from the driving model generation device 140 with data that shows above extracted specific operation, thereby determining a difference between them. The driving evaluator 151 evaluates the driving skill of a driver, for example, in three stages made up of high level, moderate level and low level on the basis of this difference. The driving evaluator 151 outputs information on the difference and information on the driving skill to the driving support unit 152, which gives driving support on the basis of each of the information.

Upon input of the information on the difference and the information on the driving skill from the driving evaluator 151, the driving support unit 152 generates guidance data for guiding the driving operation by a driver to the driving operation shown by a driving model. A sound device 153 for giving voice guidance for the driver and a display device 154 composed of a liquid crystal display and the like mounted inside a vehicle are electrically connected to the driving support unit 152.

The driving support unit 152 of the present embodiment, which has the above described configuration, generates image data that is able to compare changes in driving operation actually performed by a driver with the above generated driving model as guidance data. The driving support unit 152 visually displays the thus generated image data, for example, on the display device 154. The driving support unit 152 generates sound data and image data that guide the driving skill of the driver, for example, high level, medium level or low level. The driving support unit 152 outputs the thus generated sound data and image data respectively to the sound device 153 and the display device 154. The sound device 153 and the display device 154 guide evaluation results of driving operation by the driver to the driver by using sounds and images on the basis of the input sound data and the input image data. The image data that compares changes in driving operation with the above generated driving model is displayed on the display device 154, thus making it possible to guide the driving operation by the driver to a driving model.

FIG. 2 describes in detail a principle of generating a driving model by the driving model generation device and the driving model generation method of the present disclosure.

As shown in FIG. 2(a), a driver of the vehicle 100 goes to a signalized street crossing SC equipped with a traffic light that has turned green, for example. Traveling velocity of the vehicle 100 becomes equal to or greater than a threshold value Va of traveling velocity for estimating the start of the slowing down operation at a point in time t0 when the vehicle goes through a site P0. When color indicated by the traffic light installed on the signalized street crossing SC turns from green to yellow and to red sequentially, for example, at a point in time t1, when the vehicle 100 goes through a site P1, the driver of the vehicle 100 steps on the brake pedal, thereby starting the slowing down operation. As a result, at a point in time t2, when the vehicle 100 arrives at a site P2 spaced away from the site P1 by a distance L12, the vehicle 100 stops, thereby terminating the slowing down operation. Thereafter, when color indicated by the signalized street crossing SC turns from red to green, the driver of the vehicle 100 steps on the accelerator pedal to start the vehicle 100. As described so far, vehicle behavior data that shows behavior of the vehicle 100 at the time of traveling on a signalized street crossing SC and vehicle operation data that shows the slowing down operation by the driver are recorded in the above described operation information recorder 120.

As shown in FIG. 2(b), upon extraction of data that shows evaluation-target the slowing down operation, the target action extractor 130 of the present embodiment specifies vehicle behavior data and vehicle operation data in which traveling velocity of the vehicle 100 becomes equal to or greater than Va and then the traveling velocity of the vehicle 100 becomes 0 m/s and also specifies time for obtaining the data. The target action extractor 130 extracts data that shows the traveling velocity of the vehicle 100 in which the traveling velocity of the vehicle 100 becomes equal to or greater than Va and then becomes 0 m/s, that is, the data shown by a region Rα in FIG. 2(b). The thus extracted region Rα, that is, the distance L12, which is a movement distance in which the vehicle 100 has traveled from the point in time t1 to the point in time t2, is determined by the traveling distance calculator 141.

As shown by change Ia1 in FIG. 2(c), the vehicle 100 in the region Rα is gradually increased in deceleration after the point in time t1 and becomes a maximum value am at a point in time t3, when the vehicle 100 arrives at a site P3. Thereafter, as the traveling velocity of the vehicle 100 comes close to 0 m/s, the vehicle 100 is rapidly decreased in deceleration. As described so far, changes in deceleration on the basis of driving operation by a driver of the vehicle 100 becomes unstable. Accordingly, the vehicle 100 becomes unstable in traveling, that is, the traveling is low in driving skill level.

On the other hand, as shown by change Ia2 in FIG. 2(c), a driving model of deceleration generated by the driving model generation device 140 of the present embodiment undergoes such change that deceleration is increased on the basis of a constant rate of change from the point in time t1 to a point in time t4. From the point in time t4 to a point in time t5, the deceleration as is kept constant. From the point in time t5 to the point in time t2, the deceleration is again decreased on the basis of the constant rate of change.

In the present embodiment, in order to provide a driver with a model that is decreased in extent of deceleration shown by a driving model and can be actually operated by a driver, gradual change processing by the gradual change processor 143 is performed on the driving model. Thereby, the driving model is converted into a model in which the degree of change is decreased, or what is called a model in which a time constant is added. That is, the deceleration of the region Rα shown by the driving model changes from 0 to a deceleration as and from the deceleration as to 0. The above described acceleration undergoes smooth change on the basis of a predetermined rate of change during a first period of time T04 immediately after the start of slowing down and a third period of time T52 immediately before the end of slowing down. At a second period of time T45, the deceleration is kept constant. As described so far, in the present embodiment, the deceleration is decreased in the degree of change, thereby generating a driving model high in practicability.

In the present embodiment, evaluation is made in such a manner that the smaller a difference of Oab between the change Ia2 of the driving model and the change Ia1 of the deceleration on the basis of driving operation by a driver of the vehicle 100, the higher the driving skill of the driver is, and the larger the difference of Oab, the lower the driving skill of the driver is.

In FIGS. 3 and 4, a detailed description will be given of a manner of generating a simple model acting as an original model of the driving model of the present embodiment and gradual change processing for the thus generated simple model. FIGS. 3(a) and 3(b) show respectively traveling velocity and deceleration of the vehicle 100 in the region Rα previously in FIG. 2(b). Change Sv1 indicated by a solid line in FIG. 3(a) shows changes in actual traveling velocity on the basis of driving operation by a driver of the vehicle 100, and change Sv2 indicated by a broken line shows a simple model of traveling velocity generated by the model generator 142. Change Sv3 indicated by an alternately long- and short-dashed line shows a model of traveling velocity on which gradual change processing has been performed by the gradual change processor 143. In a similar manner, change Sa1 indicated by a solid line in FIG. 3(b) shows changes in actual deceleration on the basis of driving operation by the driver of the vehicle 100, and change Sa2 indicated by a broken line shows a simple model of deceleration generated by the model generator 142. Change Sa3 indicated by an alternately long- and short-dashed line shows a model of deceleration on which gradual change processing has been performed by the gradual change processor 143.

The traveling velocity of the vehicle 100 at the start of slowing down actions is given as V0, and the traveling velocity thereof at the end of slowing down actions, that is, when the vehicle 100 has stopped, is given as V1. On the assumption that a movement distance (distance L12) of the vehicle 100 in which the traveling velocity of the vehicle 100 is decreased from velocity V0 to velocity V1 is given as x, and acceleration of the vehicle 100 is given as a, the following expression 1 is satisfied by the law of linear motion of uniform acceleration.

$$(V1)^2 - (V0)^2 = 2ax \qquad \text{Expression 1}$$

When the vehicle 100 has stopped, traveling velocity V1 is expressed as 0 m/s, a is solved in the above expression 1 to obtain the following:

$$a = -(V0)^2/(2x) \qquad \text{Expression 2}$$

When the distance L12, or a movement distance of the vehicle 100 is substituted for x in the above expression 2, there is determined constant deceleration necessary when the distance L12 is given, that is, the change Sa2 illustrated in FIG. 3(b). The change Sa2 acts as a simple model in such a situation where the traveling velocity of the vehicle 100 is expressed as V0 and also the distance L12 is given as a movement distance up to a stop position. On the assumption that the traveling velocity of the vehicle 100 undergoes change on the basis of the constant deceleration, as illustrated in FIG. 3(a), there is determined the change Sv2 of traveling velocity which can be used as a reference when the constant deceleration is given. In the present embodiment, there are also determined the change Sv3 of traveling velocity and the change Sa3 of deceleration when gradual change processing is performed.

As illustrated in FIG. 4(a), even if the traveling velocity at the start of the slowing down operation by a driver of the vehicle 100 is V0 and common to each other, due to a mutual difference in timing when the color indicated by a traffic light is changed, a distance from a site at the start of the slowing down operation to a position to be stopped is different from each other, for example, distance L14, distance L12 (L12<distance L14) and distance L13 (L13<distance L12).

The longer the distance from a site at the start of the slowing down operation to a position to be stopped, slower slowing down can be carried out. On the other hand, the shorter the distance from a site at the start of the slowing down operation to a position to be stopped, more abrupt slowing down is required. As a result, as shown in FIG. 4(a), changes of actual traveling velocity of the vehicle 100 when the distance L14, the distance L12 and the distance L13 are given are different from each other in the respective modes of change Av1, change Sv1 and change Bv1. They are also different from each other in extent of attenuation of the traveling velocity. In a similar manner, as shown in FIG. 4(b), changes of actual deceleration of the vehicle 100 when the distance L14, the distance L12 and the distance L13 are given are different from each other in the respective modes of change Aa1, change Sa1 and change Ba1. They are also different from each other in a maximum deceleration.

However, in the present embodiment, the driving model acting as a reference is generated on the basis of the initial state quantity and the last state quantity of the vehicle 100 when specific driving operation has been performed. Thereby, the simple model of the traveling velocity that can act as a reference when movement distances of the vehicle 100 are given as the distance L14, the distance L12 and the distance L13 is generated for each movement distance of the vehicle 100 at the time of slowing down as shown in FIG. 4(a) as change Av2, change Sv2 and change Bv2, in other words, in each situation of the vehicle 100 at the time of traveling.

In a similar manner, as shown in FIG. 4(b) by change Aa2, change Sa2 and change Ba2, simple models of the deceleration which can act as a reference when movement distances of the vehicle 100 are given as the distance L14, the distance L12 and the distance L13 are different from each other for each given movement distance of the vehicle 100, in other words, in each situation at the time of traveling of the vehicle 100.

In the present embodiment, on the basis of the driving model generated in each situation described above, the driver is evaluated for driving operation. Therefore, even in a situation in which hard braking has been applied, when changes of actual traveling velocity and deceleration of the vehicle 100 in the above described situation are approximate to the driving model acting as a reference, the hard braking operation is evaluated as operation in compliance with the situation and high in driving skill. In contrast, even when slow braking operation is applied but when the braking operation is greatly different from the driving model that is to be used as a reference in the situation concerned, the braking operation is evaluated as operation low in driving skill.

As described so far, according to the present embodiment, the driving model for evaluating the driving skill of a driver is generated on the basis of vehicle behavior such as a movement distance given during which a state of the vehicle 100 is shifted to a target state as well as traveling velocity and deceleration of the vehicle 100 at the start and at the end of driving operation for being shifted to the target state. Thereby, it is possible to generate a driving model in compliance with each situation of the vehicle 100. The driving model can be used to evaluate with high accuracy the driving skill appropriate for each situation of the vehicle 100.

On the other hand, FIGS. 3(b) and 4(b) show that, for example, regarding the change Sa2, deceleration is changed from 0 to a instantly at the start of the slowing down operation, t1, and at the end of the slowing down operation, t2, the deceleration is changed instantly from a to 0. That is, the simple model of deceleration shown by the change Sa2 is such that, for example, time necessary for a driver to take brake application actions or brake releasing actions is not added. Thus, this is a model having difficulty in complete reproduction.

Therefore, the gradual change processor 143 of the present embodiment carries out gradual change processing for decreasing the degree of change in vehicle behavior such as the deceleration and the traveling velocity shown by the simple model (changes Sa2, Sv2). In the present embodiment, the gradual change processing is carried out by using, for example, a time constant b for deceleration.

The time constant b denotes, for example, an inclination of deceleration at a predetermined zone in the driving model, that is, the rate of change in deceleration. In the present embodiment, gradual change processing is performed, for example, on a driving model immediately after the start of slowing down and representing about 10% of a region at the start point of a traveling zone shown by the driving model. In a similar manner, the gradual change processing is also performed, for example, on a driving model immediately before the end of slowing down and representing about 10% of a region at the end point of a traveling zone shown by the driving model.

In FIG. 3(b), it is assumed that the gradual change processor 143 is such that an initial velocity at the start point of a first period of time T04 in the region Rα is given as V0, a velocity at the end point of the first period of time T04 is given as V1 and deceleration at the end point of the first period of time T04 is given as a'. In FIG. 3(b), it is assumed that a velocity at the end point of a second period of time T45 in the region Rα is given as V2 and a velocity at the end point of a third period of time T52 in the region Rα is given as V3. It is assumed that a movement distance of the vehicle 100 at the first period of time T04 is given as X01, a movement distance of the vehicle 100 in the second period of time T45 is given as X12, and a movement distance of the vehicle 100 in the third period of time T52 is given as X23. Further, in a similar manner, it is assumed that movement time of the vehicle 100 at the first period of time T04 is given as t01, movement time of the vehicle 100 in the second period of time T45 is given as t12, and movement time of the vehicle 100 in the third period of time T52 is given as t23.

The initial velocity V0 at the start point of the first period of time T04 in the region Rα and the velocity V3 (V3=0) at the end point of the third period of time T52 are determined by results detected by the vehicle speed sensor 111.

When it is assumed that a movement distance of the vehicle 100 from the initial velocity V0=20 m/s and the start of the slowing down operation up to stop of the vehicle 100 is, for example, 100 m, deceleration shown by a simple driving model at the above described zone is determined to be −2.0 m/s² by the above described expression 2. Time t that is required from the start of the slowing down operation to stop of the vehicle 100 is determined to be 10 seconds.

The time constant b that is an amount of change in deceleration at the first period of time T04 set to account for 10% of the total distance of the region Rα and the time constant b that is an amount of change in deceleration at the third period of time T52 set to account for 10% of the total distance are determined by the following expression 3.

$$b = a'/(0.1 \times t) \quad \text{Expression 3}$$

When the velocity at the start point of each period of time is given as Vs and the movement time of the vehicle 100 at the above described period of time is given as t, the velocity Vg at the end point of a period of time is determined by the following expression 4.

$$Vg = Vs + a \cdot t + (1/2)b \cdot t^2 \quad \text{Expression 4}$$

When the movement distance of the vehicle 100 from the start of the slowing down operation to the start point of a certain period of time is given as Xs, the movement distance of the vehicle 100 from the start of the slowing down operation to the end point of the above described period of time, Xg, is determined by the following expression 5 obtained by integrating the above expression 4.

$$Xg = Xs + Vs \cdot t + (1/2)a \cdot t^2 + (1/6)b \cdot t^3 \quad \text{Expression 5}$$

The initial velocity V0 detected by the vehicle speed sensor 111, the traveling velocity (V3=0 m/s) of the vehicle 100 at the end of slowing down, the above expression 3 and a movement distance (100 m) of the vehicle 100 from the start of slowing down to the end of slowing down calculated by the traveling distance calculator 141 are substituted for the above described expression 4 and expression 5. The velocities V1, V2 and V3 (V3=0 m/s) assumed at the periods of time T04, T45, T52 are substituted respectively for the periods of time, T04, T45, T52, and the above described expression 4 is solved sequentially by a mode of the velocity V1→V2→V3.

The movement distances X01, X12, X23 assumed at the periods of time T04, T45, T52 are respectively substituted for the periods of time T04, T45, T52, and the above described expression 5 is solved sequentially by a manner of the movement distance X01→X12→X23.

The traveling velocity V3 of the vehicle 100 at the end of the slowing down operation is given as 0 m/s and the total movement distance X23 of the vehicle 100 from the start of slowing down to the end of slowing down is given as 100 ms. Therefore, an unknown value a', is determined as, for example, 2.22 . . . by solving the above described expression 4 and expression 5.

As described so far, on the basis of the time constant b set so as to account for 10% of the region Rα at the start point and 10% thereof at the end point as well as the deceleration a' of the vehicle 100 attained from the start of slowing down to the end of slowing down, there is generated a driving model on which gradual change processing has been performed. Then, there is generated a driving model of deceleration that is shown as the change Sa3 in FIG. 3(b) and as the change Aa3 and the change Ba3 in FIG. 4(b). The thus generated driving model of the deceleration is reflected in traveling velocity, resulting in generation of driving models of the traveling velocity that are shown as the change Sv3 in FIG. 3(a) and as the change Av3 and the change Bv3 in FIG. 4(a).

As described so far, in the present embodiment, gradual change processing is performed on the simple models (changes Sa2, Sv2) generated by the model generator 142, thereby generating the driving models (changes Sa3, Sv3) that are more practicable and higher in reproducibility. It is, thereby, possible to generate the driving models that are adapted to a situation of the vehicle 100 and also high in reproducibility. It is also possible to evaluate more accurately the driving skills on the basis of the above described driving model.

Figure 5:
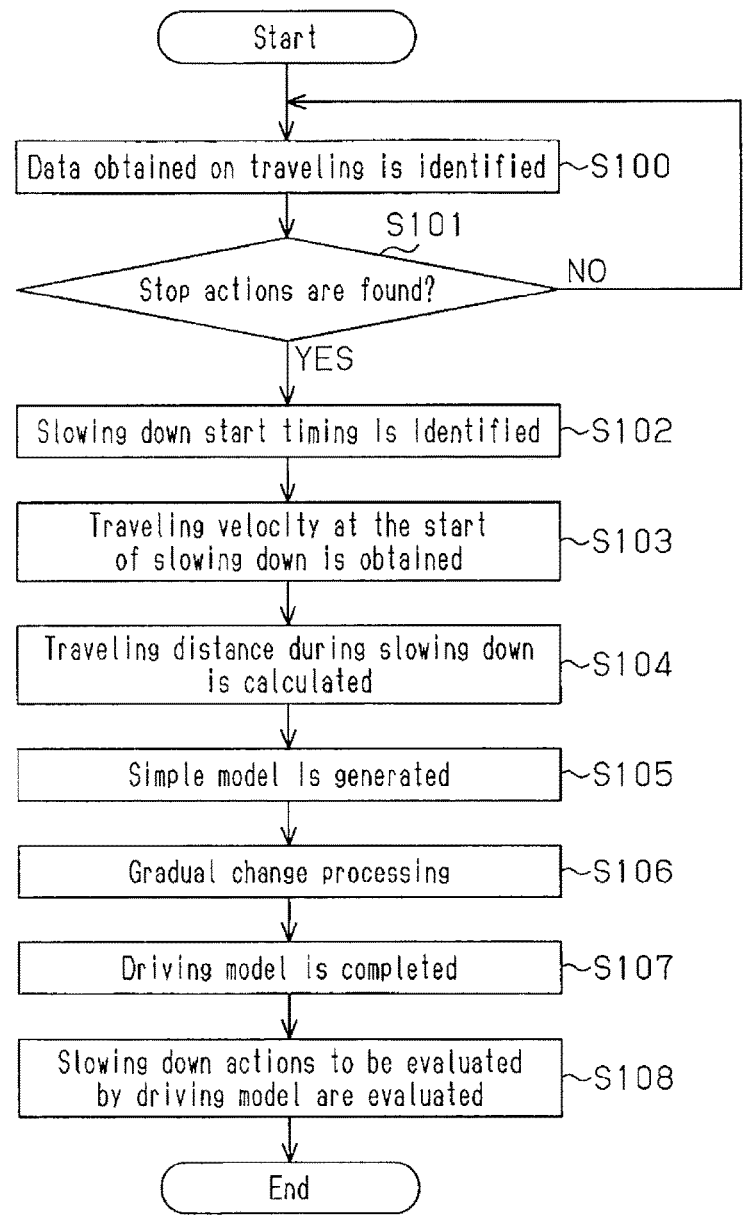
FIG. 5 is a flowchart showing one example of a procedure for generating the driving model of the embodiment in FIG. 1 and a procedure for evaluating the driving skill of a driver.

The flowchart of FIG. 5 is used to explain actions of the driving model generation device, the driving model generation method, the driving evaluation device, the driving evaluation method and the driving support system of the present embodiment.

As shown in FIG. 5, in Step S100, of data recorded in the operation information recorder 120, vehicle behavior data and vehicle operation data that have been obtained during traveling of the vehicle 100 are identified.

Of individual vehicle behavior data and individual vehicle operation data that have been identified, for example, vehicle behavior data and vehicle operation data in which the vehicle 100 is decreased in traveling velocity and thereafter arrives at the traveling velocity of 0 m/s are identified (Step S101). On the basis of the thus identified vehicle operation data and the obtained date thereof, timing at which stepping of a brake pedal is started is identified (Step S102). There is obtained data that shows a traveling velocity of the vehicle 100 at the start of slowing down (Step S103). On the basis of the thus identified timing, the traveling velocity of the vehicle 100 at the timing and the timing when the traveling velocity of the vehicle 100 arrives at 0 m/s, calculated is a traveling distance of the vehicle 100 from the start of the slowing down operation of the vehicle 100 to stop of the vehicle 100 (Step S104).

On the basis of the thus calculated traveling distance and the traveling velocity of the vehicle 100 at the start of the slowing down operation and at the end thereof, there are generated simple models at a traveling zone of the vehicle 100 when the slowing down operation has been performed (Step S105). A gradual change processing is performed on the thus generated simple models, thereby resulting in generation of driving models which correspond to the traveling velocity and the movement distance of the vehicle 100 when the slowing down operation has been performed (Steps S106, 107).

As described above, upon generation of the driving models, the traveling velocity and the deceleration shown by the vehicle behavior data that is identified in Steps S100, S101 and acts as a source for generating the driving model are compared with the driving models of traveling velocity and deceleration, thereby evaluating the slowing down operation performed by a driver (S108). Evaluation results thereof are reported to the driver, for example, by voice guidance and image guidance.

As so far described, according to the driving model generation device, the driving model generation method, the driving evaluation device, the driving evaluation method and the driving support system of the present embodiment, the following advantages are obtained.

(1) There is detected a vehicle state quantity that changes according to a driving operation by a driver. On the basis of a vehicle state quantity at the start of a specific driving operation by the driver and a vehicle state quantity at the end of the specific driving operation, there is generated a driving model of the specific driving operation that is to be used as a reference. Thereby, it is possible to generate a driving model in compliance with each situation. As a result, even where traveling areas and traffic components of the vehicle 100 are different from each other upon performance of the specific driving operation, it is possible to generate a driving model that is appropriately usable and high in versatility if situations are common or similar with each other. Further, accordingly, on generation of the driving model, it is not necessary to identify the traveling area or the traffic component of the vehicle 100 when the specific driving operation has been performed. It is possible to generate a driving model on the basis of minimally necessary components such as the respective state quantities of the vehicle 100 at the start of the specific driving operation and at the end thereof.

(2) As a state quantity of the vehicle 100, there are selected a movement distance or movement time of the vehicle 100 from the start of specific driving operation to the end thereof and an amount of change in vehicle behavior from the start of specific driving operation to the end thereof. As the above described driving model, there is generated a model showing changes in change in vehicle behavior from the start of specific driving operation to the end thereof. It is, thereby, possible to generate a driving model that shows changes in vehicle behavior necessary for shifting a traveling velocity of the vehicle 100, which is behavior of the vehicle 100 in a given movement distance from a state at the start of specific driving operation to a state at the end thereof. Thereby, it is possible to generate a driving model that is to be used as a reference in such a situation where only a limited movement distance is allowed.

(3) Gradual change processing for decreasing the degree of change of the above described model is further performed on the driving model generated as a simple model. Thereby, it is possible to generate a model that is closer to driving operation performed artificially. In other words, it is possible to generate a model that can be more easily mimicked by a driver. Driving evaluation by the use of the driving model on which gradual change processing has been performed can be further improved in evaluation accuracy.

(4) As gradual change processing performed on a simple model, processing is carried out for decreasing the degree of change in vehicle behavior, for example, in a zone of about 10% in relation to a total zone as a specific percentage including change in vehicle behavior, in the entire zone where the slowing down operation has been performed (processing a). As a result, the rate of change in vehicle behavior of the driving model that is modified by gradual change processing is automatically changed according to whether a traveling zone is long or short. Therefore, when the traveling zone is long, the driving model is modified to a mode in which the vehicle behavior will change accordingly over a long zone. On the other hand, when the traveling zone is short, the driving model is modified to a mode in which the vehicle behavior will change accordingly over a short zone. Thereby, irrespective of change in the traveling zone, gradual change processing is performed according to the traveling zone.

(5) As an amount of change in vehicle behavior, there are selected the traveling velocity and the deceleration of the vehicle 100. There is generated a driving model of the slowing down operation at the time of slowing down of the vehicle 100. It is, thereby, possible to generate a driving model of primary driving operation performed at the time of traveling of the vehicle 100. Slowing down operation will greatly influence components such as fuel consumption, safety of a traveling vehicle and travel time in a necessary zone. Accordingly, a driving model of the slowing down operation greatly influencing these components is presented to a driver and driving skill is evaluated on the basis of the above described driving model or driving support is provided, thus making it possible to effectively improve the fuel consumption, the safety of a traveling vehicle and the travel time in a necessary zone.

(6) The above generated driving model is compared with a state quantity of the vehicle 100 detected by the vehicle state detector 110 to evaluate the driving skill of an evaluation-target driver. Thus, irrespective of a situation in which the evaluation-target driver drives the vehicle 100, it is possible to make evaluation by using a driving model that is generated on the basis of the state quantity of the vehicle 100 obtained in a situation common or similar to the above described situation. It is, thereby, possible to evaluate the driving skill of the driver with high accuracy through evaluation using a driving model appropriate for each situation.

(7) On the basis of results evaluated by the driving model generation device 140, the driving support unit 152 for supporting a driver of the vehicle 100 in driving the vehicle is mounted on the vehicle 100. The driving support unit 152 is used to guide the driving operation performed by the target driver of the vehicle 100 into driving operation according to the driving model in an ex-post manner through guidance of the driving model by the sound device 153 and the display device 154 and guidance of evaluation results of the driver. Thereby, it is possible to guide the driving operation of the driver into the driving operation which is used as a reference in each situation.

Second Embodiment

In FIGS. 6 to 9, a description will be given of a second embodiment of the driving model generation device, the driving model generation method, the driving evaluation device, the driving evaluation method and the driving support system of the present disclosure, with a main emphasis placed on a difference between the second embodiment and the first embodiment. The driving model generation device, the driving model generation method, the driving evaluation device, the driving evaluation method and the driving support system of the present embodiment are also similar in fundamental configurations to the first embodiment. Thus, in FIGS. 6 to 9 as well, elements substantially the same as those of the first embodiment will be given the same reference numerals, with redundant description omitted.

Figure 6:
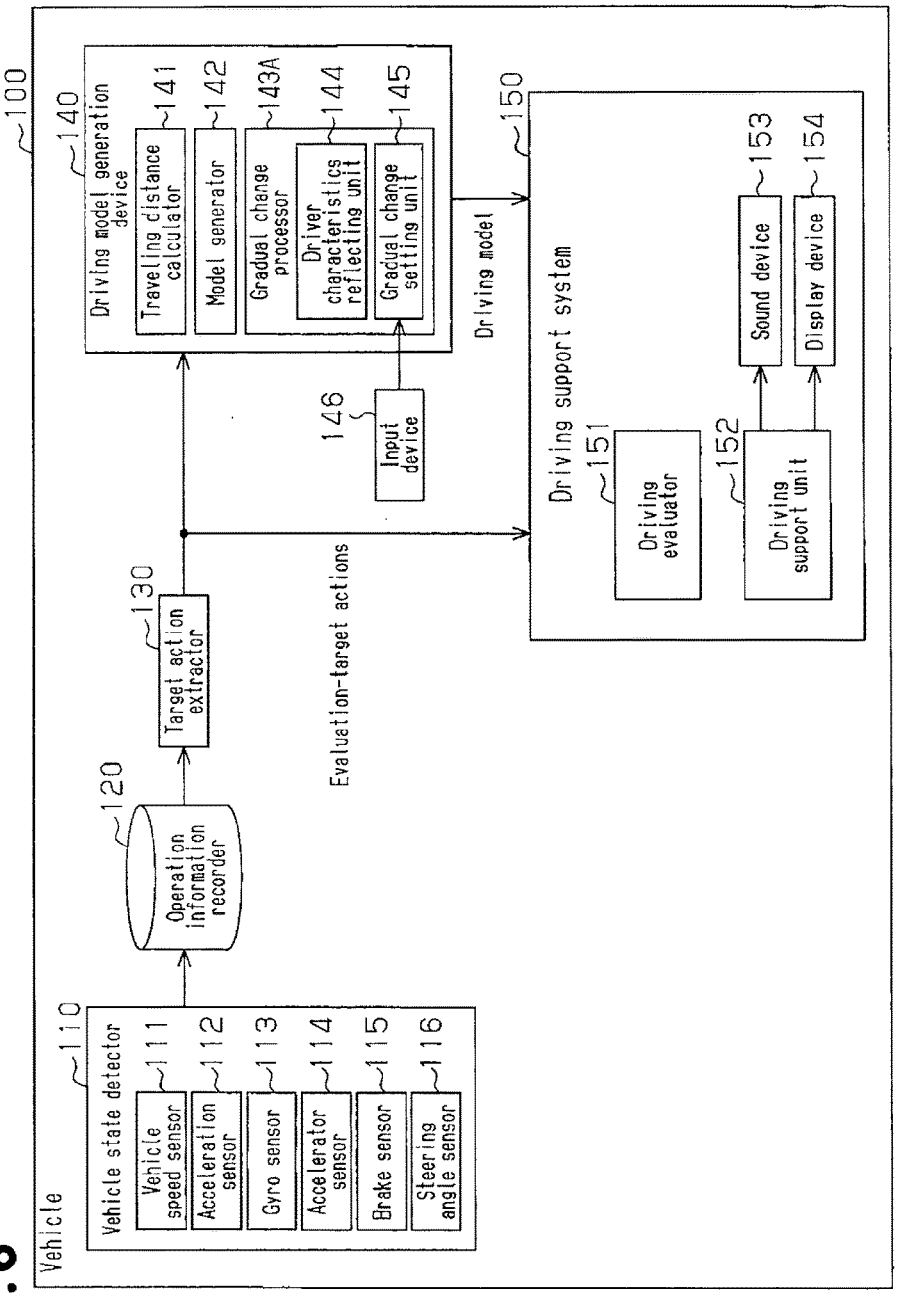
FIG. 6 is a block diagram of a vehicle to which applied are a driving model generation device, a driving model generation method, a driving evaluation device, a driving evaluation method and a driving support system according to a second embodiment.

As shown in FIG. 6, a gradual change processor 143A of the present embodiment is provided with a driver characteristics reflecting unit 144, which reflects a driving operation pattern of an evaluation-target driver in gradual change processing for a simple model. The gradual change processor 143A is provided with a gradual change setting unit 145, which reflects in the gradual change processing for a simple model selection results of the driver input into an input device 146 mounted, for example, inside a vehicle.

When vehicle behavior data and vehicle operation data that are extracted by the target action extractor 130 and show the slowing down operation by a driver are input into the driving model generation device 140, the driver characteristics reflecting unit 144 identifies a driving operation pattern of the driver on the basis of the vehicle behavior data and the vehicle operation data. Upon identification of the driving operation pattern, the driver characteristics reflecting unit 144 determines a time constant b according to the thus identified driving operation pattern. On the basis of the thus determined time constant b, gradual change processing is performed on a simple model.

A driver inputs into the input device 146 an inclination of deceleration of a driving model to be generated, which is made, for example, large, moderate or small. The driver inputs into the input device 146 timing of change in deceleration of the driving model to be generated, which is made, for example, early, middle or late. The driver inputs into the input device 146, for example, at what percentage of a zone in relation to a whole zone of the region Rα, that is, a slowing down zone, a time constant is set, or at which zone of the entire slowing down zone the time constant is set.

When results selected by the driver are input from the input device 146, the gradual change setting unit 145 determines a time constant b and a zone in which the time constant b is reflected on the basis of the selection results. The gradual change setting unit 145 performs gradual change processing on a simple model on the basis of the decision results.

The driving model on which the gradual change processing has been performed by the driver characteristics reflecting unit 144 and by the gradual change setting unit 145 is input into the driving support system 150 and used for evaluation of the driving skill of the driver.

In FIGS. 7 and 8, a description will be given of a gradual change processing made by the driver characteristics reflecting unit 144 and the gradual change setting unit 145 of the present embodiment.

Figures 7A, 7B:
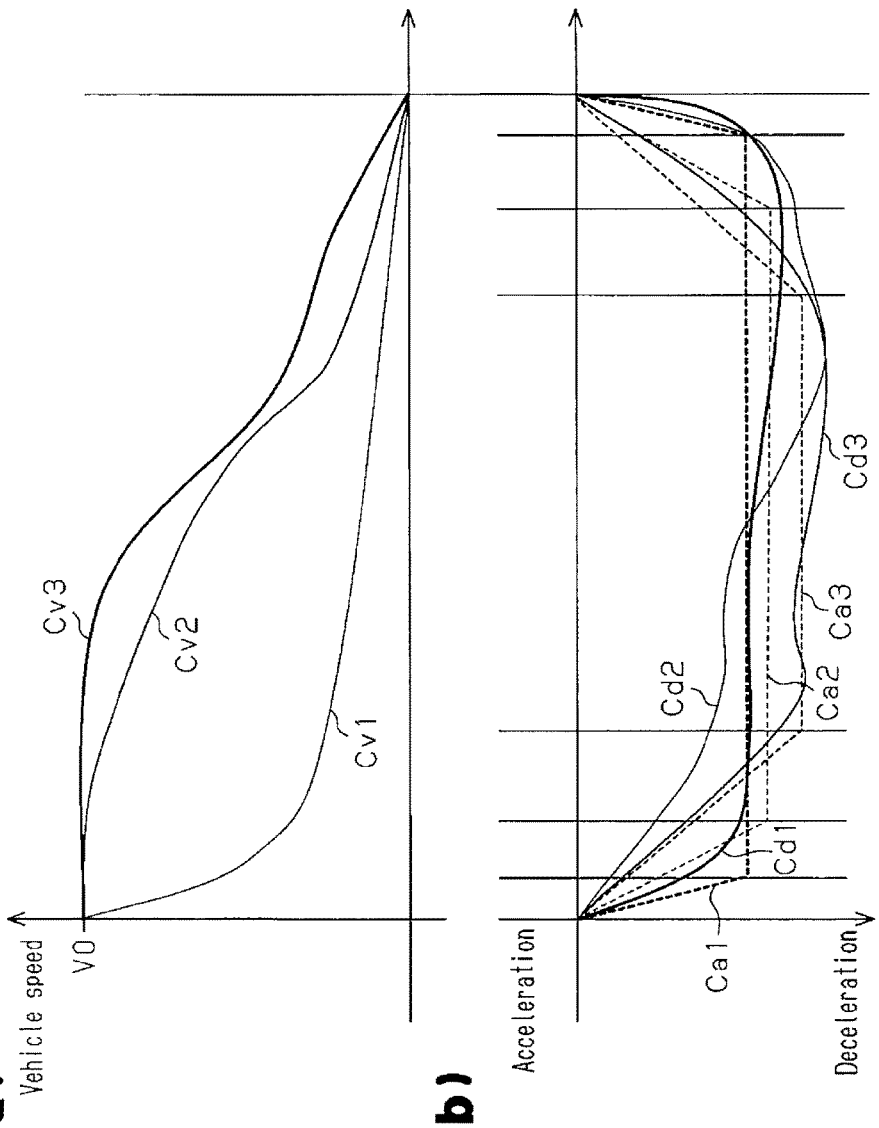
FIG. 7(a) is a diagram showing one example of a driving model of traveling velocity at the time of slowing down actions of a vehicle for each driving operation pattern of a driver.
FIG. 7(b) is a diagram showing one example of a driving model of deceleration at the time of slowing down actions of the vehicle for each driving operation pattern of the driver.

As shown in FIG. 7(a), it is assumed that as changes in traveling velocity of a driver, there are found the following changes, for example, a change of abrupt pattern Cv1, which causes abrupt slowing down after the start of the slowing down operation, a change of standard pattern Cv2, which causes standard slowing down, and a change of slow pattern Cv3, which causes slow slowing down after the start of the slowing down operation.

As shown in FIG. 7(b), changes in each deceleration due to driving operation of the driver at this time is given as an abrupt pattern Cd1, a standard pattern Cd2 and a slow pattern Cd3 corresponding respectively to the abrupt pattern Cv1, the standard pattern Cv2 and the slow pattern Cv3.

For example, when a pattern of traveling velocity based on the actual driving operation by an evaluation-target driver is the abrupt pattern Cv1 and a pattern of deceleration is the abrupt pattern Cd1, the driver characteristics reflecting unit 144 of the present embodiment corrects the standard model Ca2 generated on the basis of an initial velocity V0 and a movement distance of the vehicle 100 so as to be an abrupt model Ca1, with the above described characteristics taken into account. Thereby, there is generated a driving model that is to be used as a reference in a driving pattern of a driver who tends to perform abrupt driving operation. The abrupt pattern Cd1 based on actual driving operation is compared with the abrupt model Ca1 on which gradual change processing has been performed, thereby evaluating the driving skill of the driver.

On the other hand, for example, when the pattern of traveling velocity based on actual driving operation by an evaluation-target driver is the slow pattern Cv3 and a pattern of deceleration is the slow pattern Cd3, the driver characteristics reflecting unit 144 of the present embodiment corrects a standard model Ca2 generated on the basis of an initial velocity V0 and a movement distance of the vehicle 100 so as to be a slow model Ca3, with the above described characteristics taken into account. Thereby, there is generated a driving model that is to be used as a reference in a driving pattern of a driver who tends to perform slow driving operation. The slow pattern Cd3 based on actual driving operation is compared with the slow model Ca3, on which gradual change processing has been performed, thereby evaluating the driving skill of the driver.

For example, when a driver sets about 5% in the input device 146 as a time constant immediately after the start of the slowing down operation and immediately before the end of the slowing down operation, the gradual change setting unit 145 corrects a standard model generated on the basis of an initial velocity V0 and a movement distance of the vehicle 100 to be a 5% model Ca5, as shown in FIG. 8(a). In a similar manner, when the driver sets about 10% or about 20% in the input device 146 as a time constant immediately after the start of the slowing down operation and immediately before the end of the slowing down operation, the gradual change setting unit 145 modifies a standard model generated on the basis of an initial velocity V0 and a movement distance of the vehicle 100 to be a 10% model Ca10 or a 20% model Ca20. These models, Ca5, Ca10 and Ca20 corrected on the basis of selection results are used to evaluate the driving skill of the driver.

For example, when a driver sets in the input device 146 β1 as the rate of change in deceleration immediately after the start of the slowing down operation and β2 as the rate of change immediately before the end of the slowing down operation, as shown in FIG. 8(b), the gradual change setting unit 145 modifies a simple model generated on the basis of an initial velocity V0 and a movement distance of the vehicle 100 to a model Cβ1. In a similar manner, when the driver sets in the input device 146 β3 as the rate of change in deceleration immediately after the start of the slowing down operation and β4 as the rate of change immediately before the end of the slowing down operation, the gradual change setting unit 145 modifies a simple model generated on the basis of an initial velocity V0 and a movement distance of the vehicle 100 to a model Cβ2. These models Cβ1, Cβ2 corrected on the basis of selected results are used to evaluate the driving skill of the driver.

In FIG. 9, a description will be given of operation of the driving model generation device, the driving model generation method, the driving evaluation device, the driving evaluation method and the driving support system of the present embodiment on the basis of comparison with FIG. 5 given previously.

As shown in FIG. 9, by means of processing performed in Step S100 to Step S105, there is generated a simple model on the basis of an initial velocity V0 of the vehicle 100 and, for example, the movement distance of the vehicle 100 from the start of slowing down to the end of slowing down. In this case, first, the driver characteristics reflecting unit 144 determines whether driver characteristics showing a driving operation pattern of a driver can be identified or not (Step S110). When the driver characteristics can be identified, there is carried out gradual change processing, which reflects the thus identified results (Step S111).

On the other hand, although no driver characteristics are identified, when, for example, conditions of the driving model desired by a driver are input into the input device 146 (Step S112: YES), the thus input results are reflected in gradual change processing (Step S113).

However, when no driver characteristics are identified and no conditions of the driving model are input into the input device 146 (Step S112: NO), there is carried out gradual change processing for generating, for example, a 10% model Ca10 set in advance as a standard model (Step S114).

As described so far, generated are driving models, on each of which gradual change processing is performed, and evaluation is made for the driving skill of the driver of the vehicle 100 on the basis of these driving models.

As described so far, according to the driving model generation device, the driving model generation method, the driving evaluation device, the driving evaluation method and the driving support system of the present embodiment, not only the previously described advantages of (1) to (7) but also the following advantages are obtained.

(8) The decreasing rate of the degree of change in vehicle behavior by the gradual change processor 143 is modified according to a driving pattern of a driver. Therefore, it is possible to modify a driving model into a model in compliance with the driving skill and habit inherent in a driver who is a target user. Thereby, it is possible to provide a driving model in compliance with the driving skill and inherent habit of the driver and also to provide automatically a driving model that matches an intention of the driver.

(9) The decreasing rate of the degree of change in vehicle behavior by the gradual change processor 143 is modified according to a percentage of a time constant set by a driver. Therefore, it is possible to generate a driving model that matches the results selected by the driver of the vehicle 100. Thus, the driving model is generated on the basis of a higher flexibility.

Third Embodiment

In FIGS. 10 and 11, a description will be given of a third embodiment of the driving model generation device, the driving model generation method, the driving evaluation device, the driving evaluation method and the driving support system of the present disclosure, with a main emphasis placed on a difference between the third embodiment and the first embodiment. The driving model generation device, the driving model generation method, the driving evaluation device, the driving evaluation method and the driving support system of the present embodiment are also similar in fundamental configurations to the first embodiment. Therefore, in FIGS. 10 and 11 as well, substantially the same elements as those of the first embodiment will be given the same reference numerals, with redundant description omitted.

In the present embodiment, as evaluation-target specific driving operation, evaluation is made for the speeding up operation at the time of starting the vehicle 100 and steering operation during traveling on a curve. The target action extractor 130 of the present embodiment extracts data that shows, for example, the speeding up operation and the steering operation as specific vehicle behavior data and vehicle operation data to be extracted from the above described operation information recorder 120. As data that shows the steering operation, for example, results detected by the gyro sensor 113 and the steering angle sensor 116 are used.

Figure 10A:
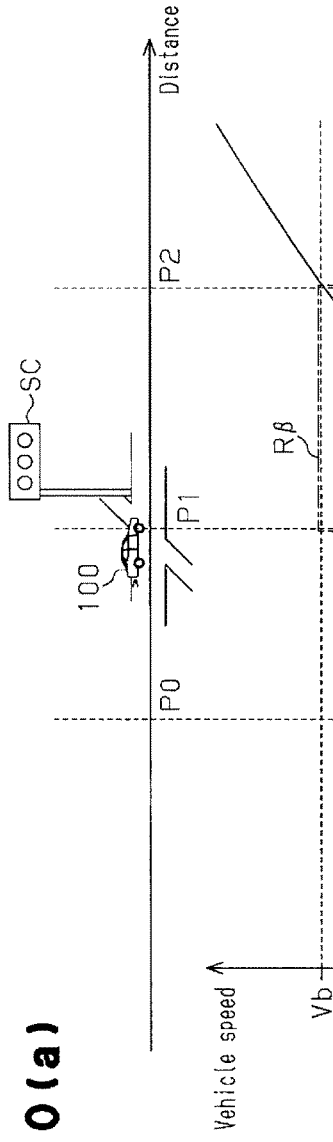
FIG. 10(a) is a diagram showing one example of a traveling route in which speeding up actions have been taken with regard to a driving model generation device, a driving model generation method, a driving evaluation device, a driving evaluation method and a driving support system of according to a third embodiment.

As shown in FIG. 10(a), it is assumed that the vehicle 100 stops temporarily in front of a signalized street crossing SC equipped with a traffic light that has turned red and the vehicle 100 starts to travel when the color indicated at the signalized street crossing SC turns from red to green.

Figure 10B:
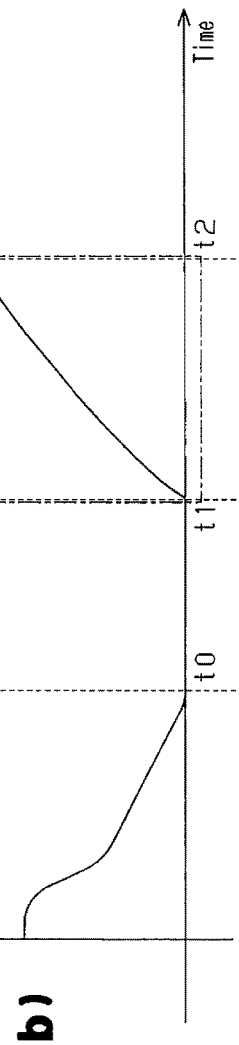
FIG. 10(b) is a time chart showing an example of changes in traveling velocity at the time of speeding up actions of a vehicle that is a target of generating a driving model.

As shown in FIG. 10(b), the traveling velocity of the vehicle 100 is decreased and shifted to 0 m/s at a point in time t0 when the vehicle 100 goes through the site P0, by which a state of the vehicle 100 is judged to be shifted to a stop state.

When operation for starting the vehicle 100, which has stopped at the site P1, is performed at the point in time t1, the vehicle 100 is gradually speeded up. For example, the traveling velocity of the vehicle 100 reaches a value equal to or greater than a threshold value Vb for defining a speeding up zone of the vehicle 100 at the point in time t2 when the vehicle 100 goes through the site P2, by which speeding up of the vehicle 100 is judged to be ended.

The target action extractor 130 of the present embodiment extracts vehicle behavior data and vehicle operation data in the region Rβ in FIG. 10(b) as data which shows speeding up actions from the operation information recorder 120.

Figure 10C:
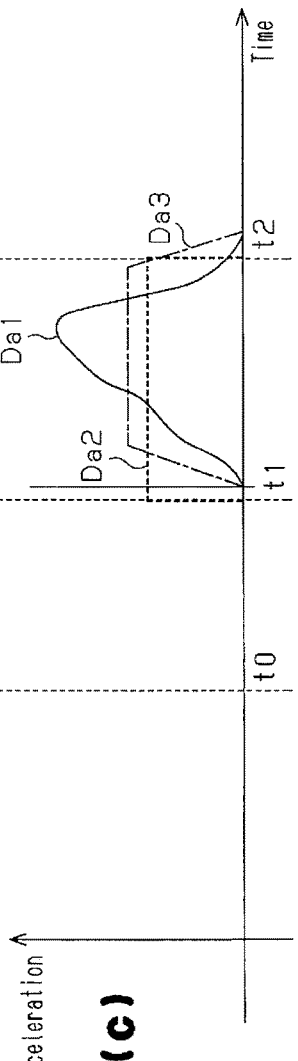
FIG. 10(c) is a diagram showing one example of a driving model of acceleration at the time of slowing down actions of a vehicle.

Of the thus extracted data, changes in results detected by the acceleration sensor 112 acts as a change that is shown as the change Da1 in FIG. 10(c). A simple model Da2 at the speeding up zone is generated on the basis of, for example, traveling velocity (0 m/s) of the vehicle 100, which is vehicle behavior at the start of the speeding up operation (point in time t1), traveling velocity (Vb) of the vehicle 100, which is vehicle behavior at the end of the speeding up operation (point in time t2), and a movement distance of the vehicle 100 from the start of the speeding up operation to the end thereof.

Gradual change processing on the basis of the above described expression 3, expression 4 and expression 5 is performed on the thus generated simple model Da2, thereby generating a driving model Da3 that is decreased in the degree of change in acceleration and can be used as a reference. Thus, the driving model Da3 is generated. The thus generated driving model Da3 is compared with the change Da1 based on actual driving operation of a driver to evaluate the driving skill of the driver.

FIG. 11(a) shows a concrete example about steering operation. It is assumed that the vehicle 100 advances from a site Ps connected to a straight road into a curve with a predetermined curvature radius built over a site Pg and steering operation is performed for traveling along the curve.

FIG. 11(b) shows change Tv1 of steering angle by driving operation of a driver. At the point in time t0, when the vehicle 100 arrives at the site Ps, where the curve starts, the vehicle 100 is changed in steering angle. While the vehicle 100 travels on the curve from the point in time t1 to the point in time t2, the steering angle is kept at about θα. At the point in time t3, when the vehicle 100 arrives at the site Pg, where the curve ends, and thereafter, the steering angle is returned to 0.

FIG. 11(c) shows the change Ta1 of angular velocity of the steering by a driver during the period of time shown in FIG. 11(b). At the point in time t0, when the vehicle 100 arrives at the site Ps, where the curve starts, the angular velocity is changed temporarily from the start of steering operation until a steering angle becomes stable at the point in time t1. The angular velocity is also changed temporarily from the point in time t2, when the vehicle 100 arrives at a site Pn in front of a predetermined distance from the site Pg, where the curve ends, to the point in time t3, when the vehicle 100 arrives at the site Pg, where the curve ends. In the present embodiment, on the basis of the above described change in steering angle or angular velocity, there are identified vehicle behavior data and vehicle operation data that show actions of the vehicle 100 on the curve.

The model generator 142 of the present embodiment generates a simple model of steering operation, for example, at the time of entering into a curve on the basis of an angle 0 at the start of steering operation, an angle θα at the end of steering operation, and a movement distance of the vehicle 100 from the point in time t0 to the point in time t1, during which steering operation has been performed. The model generator 142 generates a simple model of steering operation, for example, at the time of going out from the curve on the basis of an angle θα at the start of steering operation, an angle 0 at the end of steering operation and a movement distance of the vehicle 100 from the point in time t2 to the point in time t3, during which steering operation has been performed.

As a result, as shown as change Tv2 in FIG. 11(b), there is generated a simple model of steering angle from the time when the vehicle 100 goes into a curve to the time when it goes through the curve. As shown as change Ta2 in FIG. 11(c), there is generated a simple model of angular velocity of the steering from the time when the vehicle 100 goes into the curve to the time when it goes through the curve. In the simple model of angular velocity of the steering, a maximum angular velocity is given as ωα.

In the present embodiment as well, in order to generate a model, with consideration given to time necessary for starting and ending actions of steering operation by a driver, the gradual change processor 143 performs gradual change processing on each of the simple models of steering angle and deceleration.

FIG. 11(c) shows a driving model Ta3 of the angular velocity after gradual change processing has been performed. There is generated a model of steering angle from the time when the vehicle 100 goes into a curve to the time when it goes through the curve. As the gradual change processing has been performed, a maximum value of angular velocity of the steering is greater by a decrease in the degree of change in angular velocity than a maximum value ωα of the simple model, and the maximum value is ωα'.

A driving model Tv3 of steering angle and the driving model Ta3 of angular velocity are generated as described above. The thus generated driving models Tv3 and Ta3 are compared with changes Tv1 and Ta1 on the basis of actual driving operation by a driver, thereby evaluating the driving skill of steering operation by the driver.

As described above, according to the driving model generation device, the driving model generation method, the driving evaluation device, the driving evaluation method and the driving support system of the present embodiment, not only the above described advantages of (1) to (7) but also the following advantages are obtained.

(10) As the driving model, generated is a driving model of the speeding up operation at the time of starting the vehicle 100. Therefore, it is possible to generate the driving model that can be used as a reference even at the time of starting the vehicle 100. The driving model is used to evaluate the driving skill, thus making it possible to evaluate the speeding up operation at the time of starting the vehicle 100 as an evaluation target. Driving operation as an evaluation target is upgraded and expanded.

(11) As the driving model, a driving model of steering operation is generated when the vehicle 100 travels on a curve. Therefore, it is possible to generate the driving model that can be used as a reference even when the vehicle 100 travels on the curve. The driving model is used to evaluate the driving skill, thus making it possible to evaluate steering operation as an evaluation target even when the vehicle 100 travels on the curve. Driving operation as an evaluation target is upgraded and expanded.

(12) Driving models of the speeding up operation and steering operation are subjected to gradual change processing for decreasing acceleration, traveling velocity and the degree of change in steering angle and in angular velocity. Thereby, it is possible to generate the driving models of the speeding up operation and steering operation that are high in practicability. The driving skill can be evaluated with more accuracy on the basis of the driving models.

Fourth Embodiment

Figure 12:
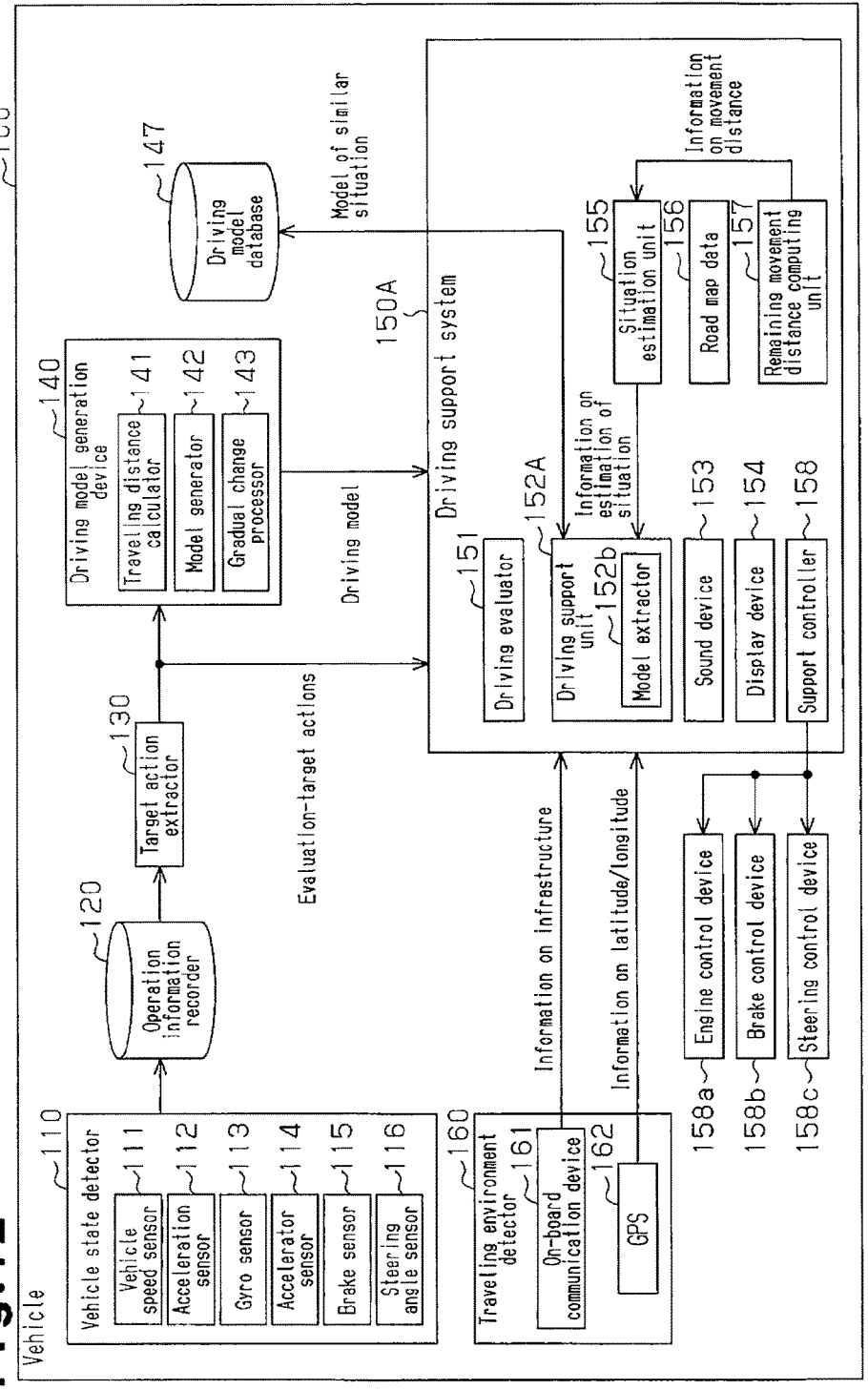
FIG. 12 is a block diagram of a vehicle to which applied are a driving model generation device, a driving model generation method, a driving evaluation device, a driving evaluation method and a driving support system according to a fourth embodiment.
Figure 13:
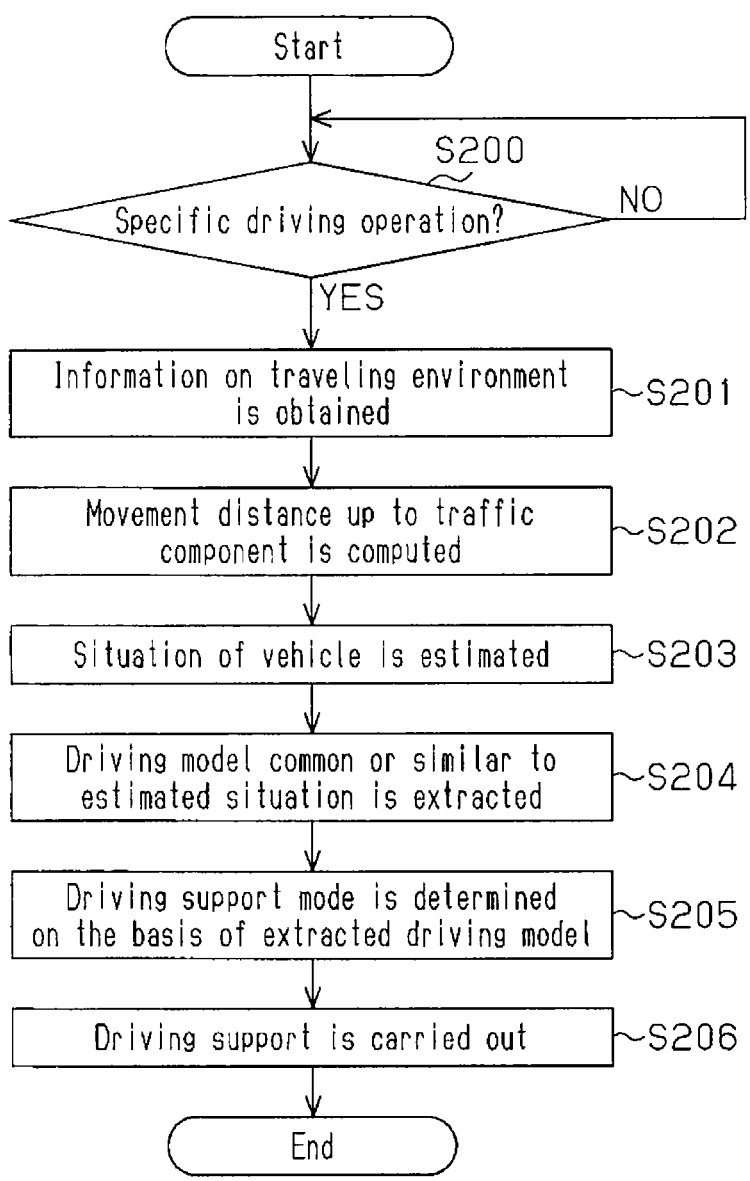
FIG. 13 is a flowchart showing one example of a driving support procedure by the driving support system given in the embodiment of FIG. 12.

In FIGS. 12 and 13, a description will be given of a fourth embodiment of the driving model generation device, the driving model generation method, the driving evaluation device, the driving evaluation method and the driving support system of the present disclosure, with a main emphasis placed on a difference between the fourth embodiment and the first embodiment. The driving model generation device, the driving model generation method, the driving evaluation device, the driving evaluation method and the driving support system of the present embodiment are also similar in fundamental configurations to the first embodiment. Therefore, in FIGS. 12 and 13 as well, substantially the same elements as those of the first embodiment are individually given the same reference numerals, with redundant description omitted.

As shown in FIG. 12, the vehicle 100 of the present embodiment is provided with a driving model database 147. The driving model database 147 registers a driving model that is generated by a model generator 142 and on which gradual change processing is performed by a gradual change processor 143. The driving model database 147 of the present embodiment registers, for example, information that shows a movement distance of the vehicle 100 on carrying out the driving operation shown by the driving model. The driving model database 147 of the present embodiment registers a driving model for each movement distance of the vehicle 100, which is the source of generating the driving model, in other words, in each situation when the vehicle 100 travels.

The vehicle 100 of the present embodiment is provided with a traveling environment detector 160, which detects traveling environments of the vehicle 100. The traveling environment detector 160 is provided with an on-board communication device 161, which makes vehicle-to-vehicle communications with a vehicle traveling around the vehicle 100 and road-to-vehicle communications with road side communications equipment installed on a road. The traveling environment detector 160 is provided with, for example, a GPS 162, which obtains latitude/longitude information that shows an absolute position of the vehicle 100.

The on-board communication device 161 obtains, from infra-structure communications equipment installed at the front of traffic components such as a signalized street crossing, information showing a distance from a site where the infrastructure communications equipment is installed to a traffic component such as a signalized street crossing and information on infra-structure which shows types of traffic components and others. The on-board communication device 161 outputs the thus obtained information on infra-structure to a driving support system 150A. The information on infrastructure includes information and others that show a color indicating cycle of a traffic light installed at a street crossing.

The GPS 162 obtains latitude/longitude information, which changes sequentially in association with traveling of the vehicle 100, and outputs sequentially the thus obtained latitude/longitude information to the driving support system 150A.

The driving support system 150A of the present embodiment is provided with a situation estimation unit 155, which estimates a situation when the vehicle 100 travels on the basis of the information on infrastructure input from the on-board communication device 161 and the latitude/longitude information input from the GPS 162.

The driving support system 150A is provided with road map data 156, which registers latitude/longitude information on specific traffic components, which need specific driving operation such as a signalized street crossing and a curve on a road.

The driving support system 150A is also provided with a remaining movement distance computing unit 157, which computes the distance from a site at which specific driving operation is performed on a specific traffic component present ahead in a direction in which the vehicle 100 moves up to the specific traffic component, in other words, the movement distance of the vehicle 100 in which the specific driving operation is performed on the specific traffic component. The driving support unit 152A of the present embodiment is provided with a support controller 158, which provides a driver with driving support by means of controlling an on-board device mounted on the vehicle 100.

The remaining movement distance computing unit 157 specifies types of traffic components such as a street crossing, a temporary stop position, a railroad crossing and a curve present in the vicinity of the vehicle 100 that require specific driving operation, for example, the slowing down operation, stop operation, start operation (speeding up operation) and steering operation and also specifies positions of the traffic components on the basis of the information on infrastructure and the latitude/longitude information input into the driving support system 150.

When becoming aware of the fact that specific driving operation has started according to a traffic component present in the vicinity of the vehicle 100 on the basis of vehicle operation data input each time from the vehicle state detector 110 to the driving model generation device 140, the remaining movement distance computing unit 157 computes the movement distance of the vehicle 100 from the position at the start of the driving operation to the position of the traffic component. The remaining movement distance computing unit 157 outputs to the situation estimation unit 155 information showing a type of the identified traffic component and the computed movement distance.

When information that shows the type of the traffic component and the movement distance up to the traffic component is input from the remaining movement distance computing unit 157, the situation estimation unit 155 estimates a present situation of the vehicle 100 on the basis of the above described information.

That is, when the slowing down operation is started, for example, in front of a signalized street crossing present ahead in a direction in which vehicle 100 moves, the situation estimation unit 155 estimates that the situation of the vehicle 100 is a situation that needs hard braking because the movement distance determined by the remaining movement distance computing unit 157 is shorter than, for example, the movement distance necessary for smooth the slowing down operation and also because the traveling velocity of the vehicle 100 is greater than a predetermined value.

In contrast, the situation estimation unit 155 estimates that the situation of the vehicle 100 is a situation in which slow braking is applicable, for example, when the movement distance determined by the remaining movement distance computing unit 157 is greater, for example, than a movement distance necessary for smooth the slowing down operation. In a similar manner, the situation estimation unit 155 estimates that the situation of the vehicle 100 is a situation in which slow braking is applicable, when the vehicle 100 is in a state of slow traveling velocity, even if the movement distance determined by the remaining movement distance computing unit 157 is, for example, smaller than a movement distance necessary for smooth the slowing down operation. The situation estimation unit 155 outputs to the driving support unit 152A information that shows the estimated situation and information that shows the movement distance computed by the remaining movement distance computing unit 157.

The driving support unit 152A of the present embodiment is provided with a model extractor 152b, which extracts a driving model of a situation common or similar to the situation estimated by the situation estimation unit 155 from the driving model database 147. When information that shows the situation and the movement distance computed by the remaining movement distance computing unit 157 is input from the situation estimation unit 155, the model extractor 152b extracts from the driving model database 147 a driving model generated in a situation common or similar to an actual traveling situation of the vehicle 100 on the basis of the above described information.

Upon extraction of the driving model by the model extractor 152b, the driving support unit 152A of the present embodiment generates driving support data for supporting the driving of a driver of the vehicle 100 on the basis of the driving model. The driving support unit 152A generates sound data and image data for guiding the driving operation by the driver of the vehicle 100 into the above extracted driving model, for example, as driving support data. As the above described sound data and image data, for example, generated is such data that indicates a stepping quantity of the brake pedal or the accelerator pedal for decreasing or increasing deceleration and acceleration of the vehicle 100 according to the driving model. For example, generated is such data that guides operation timing and steering angle of the steering for decreasing or increasing the angular velocity of steering angle of the vehicle 100 according to the driving model. The above described data is output to the sound device 153 and the display device 154, by which voice guidance and image guidance for guiding the driving operation into the driving model are given to a driver who gives specific driving operation to a specific traffic component present ahead in a direction in which vehicle 100 moves. For example, the driving support unit 152A outputs to the display device 154 the driving model extracted from a driving model database 147, thereby guiding driving operation by the driver into the driving operation shown by the driving model.

The driving support unit 152A outputs the above extracted driving model to the support controller 158. The support controller 158 is electrically connected, for example, to an engine control device 158a for controlling the engine, a brake control device 158b for controlling the brake and a steering control device 158c for controlling the steering. Upon input of the extracted driving model, the support controller 158 determines controlled variables of the engine control device 158a, the brake control device 158b and the steering control device 158c for realizing various types of traveling such as slowing down, speeding up and turning that are to be performed in relation to a specific traffic component, for example, ahead in a direction in which vehicle 100 moves. The support controller 158 controls the engine control device 158a, the brake control device 158b and the steering control device 158c according to the controlled variables, thereby semi-automatically controlling the vehicle 100 according to the driving model. Thereby, the vehicle 100 is to travel on the specific traffic component in compliance with the driving model, realizing traveling that can be used by a driver as a reference.

FIG. 13 is to describe actions of the driving model generation device, the driving model generation method, the driving evaluation device, the driving evaluation method and the driving support system of the present embodiment.

As shown in FIG. 13, in Step S200, upon start of specific driving operation to be performed in relation to a specific traffic component, traveling environment information on the vehicle 100 is obtained in order to compute a distance from a position at which the specific driving operation starts to the specific traffic component (Step S201).

On the basis of the thus obtained traveling environment information, there is computed the distance from the position at which specific driving operation starts to the traffic component contributing to the specific driving operation, that is, the movement distance that the vehicle 100 present at the position at which the specific driving operation starts needs to arrive at the traffic component that is a position at which the specific driving operation ends (Step S202).

On the basis of the above obtained traveling environment information and the above computed movement distance, the situation of the vehicle 100 is estimated to be such a situation where, for example, color indicated by a traffic light ahead in a direction in which the vehicle 100 moves turns green to yellow and to red and there exists a sufficient distance up to the traffic light (Step S203).

Then, the situation of the vehicle 100 is estimated, and a driving model generated on the basis of a situation similar to the above described situation is extracted from the driving model database 147, thereby determining a driving support mode on the basis of the thus extracted driving model (Steps S204, S205). The thus determined driving support mode is carried out to provide voice guidance and image guidance to the driving model as well as guidance by means of vehicle control (Step S206). For example, the driving model is visually displayed on the display device 154.

As so far described, according to the driving model generation device, the driving model generation method, the driving evaluation device, the driving evaluation method and the driving support system of the present embodiment, not only the previously described advantages of (1) to (7) but also the following advantages are obtained.

(12) The driving support unit 152A provides the voice guidance, the image guidance, and the guidance by the vehicle control, by which driving operation by a driver is to be guided into driving operation in compliance with a driving model. Therefore, when the driver actually gives specific driving operation to a specific traffic component, there are provided the voice guidance, the image guidance and the vehicle control for realizing a driving model corresponding to the traffic component. It is, thereby, possible to guide driving operation by the driver into the driving operation that is to be used as a reference. Thus, driving model can be favorably increased in reproducibility.

Fifth Embodiment

Figure 14:
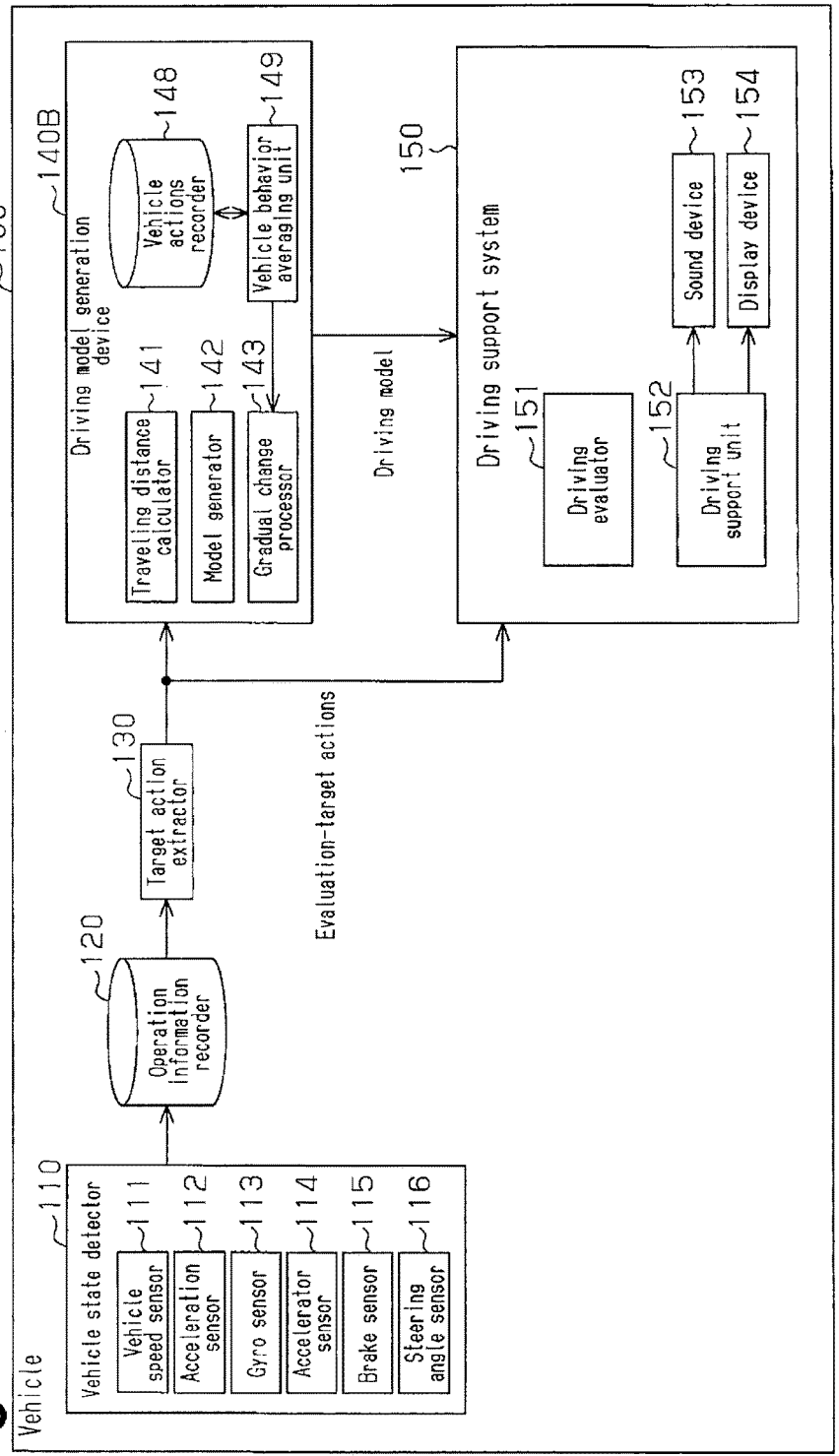
FIG. 14 is a block diagram of a vehicle to which applied are a driving model generation device, a driving model generation method, a driving evaluation device, a driving evaluation method and a driving support system according to a fifth embodiment.

In FIGS. 14 and 15, a description will be given of a fifth embodiment of the driving model generation device, the driving model generation method, the driving evaluation device, the driving evaluation method and the driving support system of the present disclosure, with a main emphasis placed on a difference between the fifth embodiment and the previously described second embodiment. The driving model generation device, the driving model generation method, the driving evaluation device, the driving evaluation method and the driving support system of the present embodiment are also similar in fundamental configurations to the first embodiment. Thus, in FIGS. 14 and 15 as well, substantially the same elements as those of the second embodiment are individually given the same reference numerals, with redundant description omitted. The vehicle 100 of the present embodiment is driven commonly by a plurality of drivers, for example.

As shown in FIG. 14, a driving model generation device 140B of the present embodiment is provided with a vehicle actions recorder 148. The vehicle actions recorder 148 records vehicle behavior data that shows specific driving operation extracted by the target action extractor 130 for each driver in each situation and for each site at which a driving model is generated or for each site characteristics. In this example, as the situation of the vehicle 100, for example, a movement distance of the vehicle 100 from a position at the start of specific driving operation to a position at the end thereof is recorded. The site characteristics correspond, for example, to a width of a road, a line shape of a road and a color indicating cycle of a traffic light.

The driving model generation device 140B of the present embodiment is provided with a vehicle behavior averaging unit 149, which performs processing for averaging vehicle behavior data recorded in the vehicle actions recorder 148 under predetermined conditions.

The vehicle behavior averaging unit 149 of the present embodiment calculates the following average values, for example, as an average value of the vehicle behavior data:

11. average value of amounts of change in vehicle behavior by the same driver;

12. average value of amounts of change in vehicle behavior on the basis of driving operation by a plurality of drivers obtained at a specific site;

13. average value of amounts of change in vehicle behavior on the basis of driving operation by the same driver obtained at a specific site; and 14. average value of amounts of change in vehicle behavior on the basis of driving operation by a plurality of drivers obtained at a plurality of sites.

FIG. 15 shows average values when certain movement distances are given. As described so far, as an average value of slowing down actions, for example, an average value of traveling velocity of the vehicle 100 at the time of slowing down and an average value of deceleration are determined for each driver and at each site. In a similar manner, as an average value of speeding up actions, for example, an average value of traveling velocities of the vehicle 100 at the time of speeding up and an average value of acceleration are determined for each driver and at each site. Further, as an average value of curve actions, for example, an average value of steering angles of the vehicle 100 at the time of traveling on a curve and an average value of angular velocities of the steering are determined for each driver and at each site.

Upon gradual change processing performed on a simple model at the time of slowing down actions, the gradual change processor 143 of the present embodiment selects an average value of traveling velocities of the vehicle 100 and an average value of deceleration thereof at each of the sites P1 to P5 by an evaluation-target driver Da, as shown in a region O1 in FIG. 15. On the basis of the thus selected average value of traveling velocities and the average value of deceleration, the gradual change processor 143 specifies a pattern of traveling velocity and a pattern of deceleration of the driver Da. The gradual change processor 143 performs gradual change processing on the simple model according to the thus identified pattern. As a result, there is generated a driving model that reflects a pattern of slowing down actions performed at each site by the driver Da.

For example, when gradual change processing is performed on a simple model at the time of curve actions, as shown in the region O2 in FIG. 15, the gradual change processor 143 selects an average value of steering angles of the vehicle 100 and an average value of angular velocities at a specific site P11 by all drivers Da to Dc . . . . On the basis of the thus selected average value of steering angles and the average value of angular velocities, the gradual change processor 143 specifies a pattern of steering angles and a pattern of angular velocities by all the drivers Da to Dc . . . . The gradual change processor 143 performs gradual change processing on the simple model according to the thus identified pattern. As a result, there is generated a driving model that reflects a pattern of curve actions usually performed by all the drivers Da to Dc . . . going through the site P11. Thereby, there is generated a driving model that reflects geographic characteristics with high accuracy at the site P11 and a standard steering operation pattern that is common to all the drivers Da to Dc . . . and high in versatility.

Further, on the other hand, for example, when gradual change processing is performed on a simple model at the time of speeding up actions, the gradual change processor 143 selects an average value of traveling velocities of the vehicle 100 by an evaluation-target driver Db at a specific site P7 and an average value of acceleration, as shown in a region O3 in FIG. 15. On the basis of the thus selected average value of traveling velocities and the average value of acceleration, the gradual change processor 143 specifies a pattern of traveling velocity and a pattern of acceleration of the driver Db. The gradual change processor 143 performs gradual change processing on the simple model according to the thus identified pattern. As a result, there is generated a driving model which reflects a pattern of speeding up actions usually performed by the driver Db going through the site P7. Thereby, there is generated a driving model which reflects with high accuracy geographic characteristics of the site P7 and a speeding up operation pattern by the driver Db at the site P7.

Still further, for example, when gradual change processing is performed on a simple model at the time of slowing down actions, the gradual change processor 143 selects an average value of traveling velocities and an average value of deceleration of the vehicle 100 by all drivers Da to Dc . . . at the specific sites P1 to P5, as shown in a region O4 of FIG. 15. On the basis of the thus selected average value of traveling velocities and the average value of deceleration, the gradual change processor 143 specifies a pattern of traveling velocities and a pattern of deceleration of all the drivers Da to Dc . . . . The gradual change processor 143 performs gradual change processing on the simple model according to the thus identified pattern. As a result, there is generated a driving model that reflects a pattern of slowing down actions usually performed by all the drivers Da to Dc . . . going through the slowing down sites P1 to P5. Thereby, there is generated a driving model that reflects a the slowing down operation pattern mutually common at the time of the slowing down operation and which is high in versatility.

As so far described, according to the driving model generation device, the driving model generation method, the driving evaluation device, the driving evaluation method and the driving support system of the present embodiment, not only the previously described advantages of (1) to (7) but also the following advantages are obtained.

(14) Gradual change processing was performed on a simple model by using a value averaged under the above described condition of 11, that is, an average value of amounts of change in vehicle behavior by the same driver. Thereby, there is generated a driving model that reflects a pattern of slowing down actions unique in the driver performed at each site by the same driver. The thus generated driving model is used to evaluate the driving, making it possible to make a driving evaluation in compliance with a pattern of an evaluation-target driver.

(15) Gradual change processing was performed on a simple model by using a value averaged under the above described condition of 12, that is, an average value of amounts of change in vehicle behavior on the basis of driving operation by a plurality of drivers obtained at a specific site. Thereby, there is generated a driving model that reflects a driving pattern performed by each driver at a specific site. The above described driving model is used to evaluate the driving, thus making it possible to make a driving evaluation high in versatility and in compliance with site characteristics.

(16) Gradual change processing was performed on a simple model by using a value averaged under the above described condition of 13, that is, an average value of amounts of change in vehicle behavior on the basis of driving operation by the same driver obtained at a specific site. Thereby, there is generated a driving model that reflects a driving pattern unique to a certain driver at a specific site. The above described driving model is used to evaluate the driving, thus making it possible to make a driving evaluation in compliance with a pattern of an evaluation-target driver and also site characteristics.

(17) Gradual change processing was performed on a simple model by using a value averaged on the basis of the above described condition of 14, that is, an average value of amounts of change in vehicle behavior on the basis of driving operation by a plurality of drivers obtained at a plurality of sites. Thereby, there is generated a driving model that reflects a standard driving pattern of a certain driving operation performed by a standard driver. The above described driving model is used to evaluate the driving, thus making it possible to make a driving evaluation having high versatility in evaluation-target driving operation.

Other Embodiments

The above described embodiments may be also carried out in the following forms.

In the above described embodiments, the operation information recorder 120 for recording vehicle behavior data and vehicle operation data detected by the vehicle state detector 110 was mounted on the vehicle 100. Further, the target action extractor 130 for extracting the vehicle behavior data and the vehicle operation data to be used for generating and evaluating the driving model from the vehicle behavior data and the vehicle operation data recorded in the operation information recorder 120 is mounted on the vehicle 100. In addition thereto, such a configuration is acceptable that the operation information recorder 120 is omitted, and the vehicle behavior data and the vehicle operation data detected by the vehicle state detector 110 are directly input into the target action extractor 130. In this configuration, when driving operation is performed by a driver of the vehicle 100, the vehicle behavior data and the vehicle operation data which show each driving operation are input from the vehicle state detector 110 into the target action extractor 130. The target action extractor 130 selects only data that shows specific driving operation, for example, the slowing down operation, the speeding up operation and steering operation, of the thus input vehicle behavior data and the vehicle operation data, and outputs the thus selected data to the driving model generation device 140. The target action extractor 130 incrementally discards data other than the vehicle behavior data and the vehicle operation data that show the specific driving operation. Thereby, it is possible to generate a driving model in a simplified configuration. Thus, the driving model can be generated on the basis of a simpler configuration and the driving skill can be evaluated on the basis of the thus generated driving model.

In above described embodiments, as shown in FIGS. 2 to 4, 7, 8, 10, 11 and others, the x axis is given as a time axis to express driving models according to the lapse of time. In addition thereto, it is acceptable to generate a driving model in which the x axis denotes a movement distance of the vehicle 100, the y axis denotes traveling velocity, deceleration, acceleration, steering angle and angular velocity of the vehicle 100, which will vary in correlation with a movement distance of the vehicle 100.

In the above described first and second embodiments, timing of starting the slowing down operation of the vehicle 100 is defined as stepping timing of a brake pedal. In addition thereto, it is acceptable that, for example, timing at which stepping of an accelerator pedal is released is defined as timing of starting slowing down operation. It is also acceptable that timing at which the traveling velocity of the vehicle 100 is equal to or lower than a predetermined traveling velocity is defined as timing of starting the slowing down operation of the vehicle 100.

In the above described third embodiment, a speeding up zone of the vehicle 100 is defined on the basis of the fact that the traveling velocity is equal to or greater than a threshold value Vb. In addition thereto, it is also acceptable that the speeding up operation is judged to be ended due to the fact that acceleration is kept substantially constant, for example, after start of the vehicle 100.

In the above described first embodiment, there is generated a driving model in which the traveling velocity of the vehicle 100 at the start of the slowing down operation is V0. In addition thereto, even if, for example, the movement distance of the vehicle 100 from the start of the slowing down operation to the end thereof is common to each other but when the traveling velocity of the vehicle 100 at the start of the slowing down operation is different from each other, as shown in FIGS. 16(a) and 16(b) as drawings corresponding to the previously described FIGS. 3(a) and 3(b), there is generated a driving model in compliance with the traveling velocity. That is, even if, for example, the movement distance of the vehicle 100 from the start of the slowing down operation to the end thereof is common to each other but when the traveling velocity of the vehicle 100 at the start of the slowing down operation is different from each other, for example, V0H (V0H>V0) and V0L (V0L<V0), the driving model is changed in change of the traveling velocity and deceleration. In a similar manner, even if the traveling velocity of the vehicle 100 at the start of the slowing down operation is common to each other but when the movement distance of the vehicle 100 up to the end of the slowing down operation is different from each other, there is generated a driving model according to each movement distance. Driving models of the acceleration at the start of the vehicle 100, the steering angle at the time of traveling on a curve and the angular velocity will also change with the traveling velocity and the movement distance of the vehicle 100 at the end of the speeding up operation as well as the steering angle and the movement distance at the start of steering operation and at the end thereof. As described above, in the present disclosure, there is generated a driving model in compliance with vehicle behavior at the start of specific driving operation and at the end thereof and the movement distance of the vehicle 100 during which the specific driving operation has been performed. Thereby, generated is a driving model in compliance with a movement distance that is allowed until completion of the specific driving operation.

In the above described embodiments, as the gradual change processing to a simple model, there is performed processing for decreasing the degree of change in vehicle behavior at a specific percentage of a zone at the start point and the end point of the zone, in the entire zone in which specific driving operation has been performed. In addition thereto, it is acceptable that the zone on which gradual change processing is performed is any zone, as long as the zone includes a change in vehicle behavior. It is also acceptable that the zone is a specific percentage of a zone that is at least one of the start point, the end point and a part of the zone between them in an entire zone on which the specific driving operation has been performed.

In the above described embodiments, as the gradual change processing to a simple model, there is performed processing for decreasing the degree of change in vehicle behavior at a specific percentage of a zone that includes a change in vehicle behavior, in the entire zone in which specific driving operation has been performed (processing a). In addition thereto, as the gradual change processing to a simple model, it is acceptable to give processing for decreasing the degree of change in vehicle behavior in a specific zone that includes at least one of the start point and the end point of the zone, in the entire zone in which specific driving operation has been performed (processing b).

According to the above described processing, gradual change processing is performed on a change in vehicle behavior, for example, at a traveling zone of about 10 m after performance of specific driving operation and at a traveling zone of about 20 m immediately before the end of specific driving operation. In a zone of starting specific driving operation or in a zone of ending the operation, the degree of change in vehicle behavior tends to increase. Thus, it is also easy to define in advance a distance of the starting zone and that of the ending zone. Thereby, carried out is gradual change processing for decreasing the degree of change in vehicle behavior at the above defined starting zone and the ending zone, and the gradual change processing can be performed by a simpler method. As a result, of vehicle behavior in a traveling zone in which specific driving operation has been performed, the vehicle behavior that has been in particular greatly changed is smoothed, and the driving model is modified into a model in compliance with actual driving.

Further, as the gradual change processing to a simple model, it is acceptable that such processing is performed for decreasing the degree of change in vehicle behavior, for example, in a zone where a vehicle travels from the time when the vehicle goes through the start point of the zone until lapse of a predetermined period of time, in the entire zone where specific driving operation has been performed (processing c). According to the above described processing, the degree of change in vehicle behavior is decreased in a zone where the vehicle 100 travels, for example, during lapse of about three seconds necessary for starting actions of specific driving operation after the vehicle 100 has gone through the start point of the zone, in the entire zone where specific driving operation has been performed. Thereby, of vehicle behavior at a traveling zone where the specific driving operation has been performed, the change in vehicle behavior at the start point of the zone that is in particular greatly changed is smoothed on the basis of a traveling period of time. Thus, the driving model is modified into a model that is in compliance with actual driving. As the gradual change processing to a simple model, it is acceptable that at least one of the processing for decreasing the degree of change in vehicle behavior, for example, in a zone where a vehicle travels during a predetermined period of time until the vehicle 100 arrives at the end point of the zone, in the entire zone where specific driving operation has been performed (processing d). According to the above described processing, the degree of change in vehicle behavior is decreased in a zone where the vehicle 100 has traveled, for example, for about five seconds when the vehicle arrives at the end point of the zone, in the entire zone where specific driving operation has been performed. Thereby, of vehicle behavior at a traveling zone where the specific driving operation has been performed, the change in vehicle behavior at the end point of the zone, which is in particular greatly changed, is smoothed on the basis of a traveling period of time. Thus, the driving model is modified into a model in compliance with actual driving. For example, as the gradual change processing to a simple model, it is acceptable that there is carried out processing for decreasing the degree of change in vehicle behavior at movement timing of a specific percentage including a change in vehicle behavior, of movement time during which the slowing down operation has been performed. According to the above described processing, for example, when movement time of the vehicle 100 for slowing down actions of the vehicle 100 is 10 seconds, gradual change processing is performed, for example, on a simple model of movement time immediately after the start of the slowing down operation that is set so as to account for about 10% of the entire distance, that is, the traveling velocity and the deceleration of the vehicle which have changed for about three seconds from the start of the slowing down operation. According to the processing, for example, when movement time of the vehicle 100 for slowing down actions of the vehicle 100 is 10 seconds, gradual change processing is performed on a simple model of movement time immediately before the end of the slowing down operation, for example, which is set so as to account for about 10% of the entire distance, that is, a simple model of the traveling velocity and the deceleration of the vehicle which have changed for about three seconds before the end of the slowing down operation.

In the above described embodiments, gradual change processing is performed on the basis of the above described expression 3, expression 4, expression 5 and others. In addition thereto, any gradual change processing may be acceptable as long as the processing is to decrease the degree of change in vehicle behavior, while kept are various state quantities of the vehicle 100 at the start of specific driving operation and at the end thereof, for example, state quantities such as the traveling velocity and the deceleration of the vehicle 100 at the start of the slowing down operation and at the end thereof as well as the movement distance of the vehicle 100 during a period of time when the slowing down operation has been performed. That is, computation used in the gradual change processing may be modified, whenever necessary, if the degree of change in vehicle behavior is allowed to be decreased, while each state quantity of the vehicle 100 at the start of specific driving operation and at the end thereof is kept at an actual state quantity on the basis of driving operation by a driver.

In the above described embodiments, the gradual change processors 143, 143A for decreasing the degree of change in vehicle behavior shown by a simple model were mounted on the driving model generation devices 140, 140B. In addition thereto, such a configuration is acceptable that the gradual change processors 143, 143A are omitted or no gradual change processing is performed on a simple model. According to the above described configuration, a simple model generated by the model generator 142 is presented to a driver, and the simple model is used to evaluate the driving skill and give various types of driving support. Even in the above described configuration, on the basis of a driving model that reflects each situation of the vehicle 100, the driving skill is evaluated and various types of driving support are given. Thereby, it is possible to make an evaluation of the driving skill and provide various types of driving support in compliance with a situation of the vehicle 100.

Figure 17:
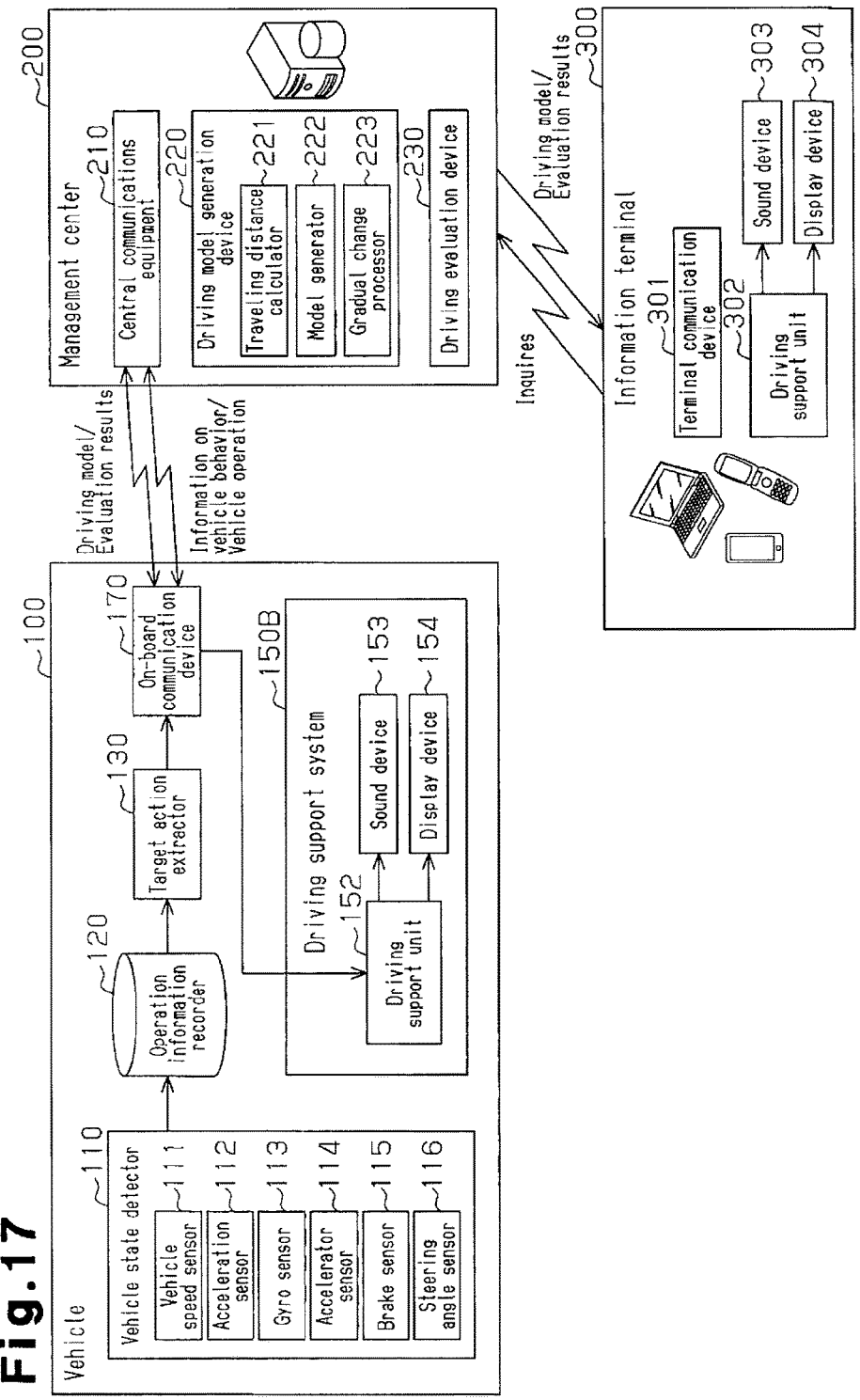
FIG. 17 is a block diagram showing a vehicle, a management center and an information terminal to which applied are a driving model generation device, a driving model generation method, a driving evaluation device, a driving evaluation method and a driving support system of another modification.

In the above described embodiments, the driving model generation devices 140, 140B and the driving evaluator 151 are mounted on the vehicle 100. In addition thereto, for example, as shown in FIG. 17 as a drawing corresponding to the previously described FIG. 1, FIG. 6, FIG. 12 or FIG. 14, such a configuration is acceptable that no driving model generation devices 140, 140B are mounted on the vehicle 100. Such a configuration is also acceptable that a driving model generation device 220 having a traveling distance calculator 221, a model generator 222, and a gradual change processor 223 so as to provide functions similar to those of the driving model generation devices 140, 140B is mounted in the management center 200. Such a configuration is also acceptable that no driving evaluation device is mounted on the driving support system 150B mounted on the vehicle 100 but a driving evaluation device 230 is mounted in the management center 200. In this configuration, vehicle behavior data and vehicle operation data obtained by a plurality of vehicles including the vehicle 100 are transmitted via wireless communications between the on-board communication device 170 and the central communications equipment 210 from the vehicle 100 to the management center 200. The driving model generation device 220 mounted in the management center 200 generates a driving model on the basis of the vehicle behavior data and the vehicle operation data transmitted from the vehicle 100 and others. The thus generated driving model is, for example, delivered from the management center 200 to the vehicle 100 and others. The driving evaluation device 230 mounted in the management center 200 evaluates the driving skill of an evaluation-target driver on the basis of the thus generated driving model as well as the vehicle behavior data and the vehicle operation data transmitted from the vehicle 100 operated and driven by the evaluation-target driver or other vehicles. The evaluation results are delivered, for example, from the management center 200 to the vehicle 100 that is operated and driven by the evaluation-target driver. According to the above described configuration, it is possible to generate a driving model exclusively on the basis of the management center 200, and it is also possible to easily mount high performance computation processing equipment and a large capacity database in the management center 200. Thereby, it is possible to generate a driving model at high speed and with high accuracy and also to store a great number of thus generated driving models. As described so far, driving models are generated in the management center 200, thus making it possible to generate a plurality of driving models on the basis of driving operation by drivers of a plurality of vehicles. It is, therefore, possible to generate a driving model on the basis of driving operation performed in a wider variety of situations. As a result, driving operation performed on a road in which various situations are found can be evaluated with high accuracy by using many driving models. It is also acceptable that a device similar to the above described management center is mounted on a specific vehicle and information necessary for generating a driving model of other vehicles is collected by the specific vehicle through vehicle-to-vehicle communications between the specific vehicle and the other vehicles. It is also acceptable that through vehicle-to-vehicle communications between the specific vehicle and the other vehicles, the driving model generated by the specific vehicle is delivered to the other vehicles. Accordingly, the specific vehicle is only provided with functions to generate a driving model and, therefore, a vehicle which uses the driving model can be made simple in configuration. Thereby, even in such circumstances in which communications with the management center and others are difficult, if communications with the specific vehicle having management center functions can be secured, it is possible to deliver a driving model generated by the specific vehicle to a user of the driving model, that is, a vehicle.

In the above described embodiments, evaluation results of the driving skill on the basis of the above described driving models and the previously described driving models were to be used by vehicle 100. In addition thereto, for example, as shown in FIG. 17 as a drawing corresponding to the previously described FIG. 1, FIG. 6, FIG. 12 or FIG. 14, such a configuration is acceptable that driving models generated by the management center 200 and evaluation results of the driving skill are delivered to, for example, mobile information terminal devices including a smart phone or an information terminal 300 composed of a personal computer. In the above described configuration, for example, when a user of the information terminal 300 requires delivery of a driving model and evaluation results of the driving skill, the thus required information is transmitted from a terminal communication device 301 to the management center 200. In response to the thus required information, the driving model and the evaluation results of the driving skill are delivered to the information terminal 300. In the information terminal 300, for example, the thus delivered driving model and the evaluation results of the driving skill are informed of the user of the information terminal 300 via voice guidance and image guidance by a sound device 303 and a display device 304. For example, such a configuration is acceptable that a driving support unit 302 having functions similar to those of the above described driving support unit 152 is mounted on the information terminal 300. In the above described configuration, the driving support unit 302 uses the driving model and the evaluation results of the driving skill delivered from the management center 200 to give driving support for guiding, for example, driving operation by the user of the information terminal 300 who is a driver of the vehicle 100 into the driving model via the voice guidance and the image guidance by the sound device 303 and the display device 304.

In the configuration illustrated in the previously described FIG. 17, information which shows a vehicle state quantity necessary for generating a driving model was to be transmitted by way of wireless communications between the vehicle 100 and the management center 200 from the vehicle 100 to the management center 200. In addition thereto, as shown in FIG. 18 as a drawing corresponding to FIG. 17, it is acceptable that through wire communications or wireless communications between the terminal communication device 301 equipped in the information terminal 300 such as a smart phone used by a passenger of the vehicle 100 or others and the on-board communication device 170 of the vehicle 100, information showing a vehicle state quantity is temporarily kept at the information terminal 300 from the vehicle 100. It is acceptable that the information showing the vehicle state quantity which is kept by the information terminal 300 is transmitted from the information terminal 300 to the management center 200 by means of wireless communications between the terminal communication device 301 of the information terminal 300 and the central communications equipment 210 of the management center 200. In the above described configuration, for example, the driving model generated by the management center 200 and the thus evaluated results are delivered from the management center 200 to the information terminal 300. The driving model and the evaluation results are informed of a driver by the voice guidance and the image guidance via the sound device 303 and the display device 304 of the information terminal 300. For example, the driving model and evaluation results of the driving skill level temporarily delivered to the information terminal 300 are transmitted from the information terminal 300 to the vehicle 100 by means of wire communications or wireless communications between the terminal communication device 301 of the information terminal 300 and the on-board communication device 170 of the vehicle 100. The driving model and evaluation results of the driving skill level transmitted to the vehicle 100 are used in the driving system 150B. Accordingly, information necessary for generating a driving model can be aggregated at the management center 200 by using the information terminal 300, which is already provided with communications facilities. Thus, sources of collecting information necessary for generating the driving model are upgraded and expanded. In addition, it is acceptable that when a GPS or the like is installed on the information terminal 300, the traveling position, traveling velocity, acceleration and others of the vehicle 100 are obtained on the basis of detection results of the GPS. In a similar manner, it is acceptable that where the information terminal 300 is provided with a traveling velocity sensor, an acceleration sensor or the like, the traveling position, traveling velocity, acceleration and others of the vehicle 100 are obtained on the basis of results detected by each of the sensors. It is also acceptable that information that shows the traveling position, traveling velocity, acceleration and others of the vehicle 100 obtained by information terminal 300 is used for generation of a driving model and evaluation of the driving skill as information showing a state quantity of the vehicle 100. Thereby, it is possible to obtain the information showing a state quantity of the vehicle 100 solely by the information terminal 300 and send directly the information obtained by the information terminal 300 from the information terminal 300 to the management center 200. Further, such a configuration is also acceptable that the above described driving model generation devices 140, 220, the driving support system 150 and others are mounted on the information terminal 300. Thereby, on the basis of the information obtained by the information terminal 300, it is possible to generate a driving model, evaluate the driving skill and give driving support and others solely by the information terminal 300.

In the above described first and second embodiments, the traveling velocity and deceleration of the vehicle 100 are selected as vehicle behavior. In the above described third embodiment to fifth embodiment, the acceleration and steering angle of the vehicle 100 are selected as the vehicle behavior. In addition thereto, it is acceptable that as the vehicle behavior, what is called, jerk is selected and on the basis of the jerk, a driving model is generated or the driving model is used to evaluate the driving skill. It is also acceptable that the vehicle behavior that is used in generating a driving model is any vehicle behavior, as long as it shows a state quantity of the vehicle 100 so as to change in association with driving operation by a driver. Thus, the vehicle behavior may be modified or added, whenever necessary.

In the above described first and second embodiments, as specific driving operation, there is selected the slowing down operation of the vehicle 100 when stopped at a signalized street crossing SC. In the above described third embodiment to fifth embodiment, as the specific driving operation, there are also selected the speeding up operation of the vehicle 100 at the time of start and steering operation when the vehicle travels on a curve. In addition thereto, it is acceptable that the specific driving operation includes, for example, the slowing down operation performed at a site where only slowing down is needed, and left- or right-turn operation at a signalized street crossing SC. It is also acceptable that the specific driving operation is any operation which is performed for shifting a state quantity of the vehicle 100 to a target state quantity. The present disclosure is applicable, as long as there are known a state quantity of the vehicle 100 at the start of the specific driving operation and at the end thereof as well as a movement distance of the vehicle 100 during which the specific driving operation is in progress.

As a state quantity of the vehicle 100, there are selected an amount of change in vehicle behavior and a movement distance of the vehicle 100. In addition thereto, it is acceptable that as a state quantity of the vehicle 100, there are selected, for example, amounts of change in vehicle behavior at the start of specific driving operation and at the end thereof as well as a period of time during which the specific driving operation has been performed. It is also acceptable that a driving model is generated on the basis of the thus selected state quantity of the vehicle 100. Accordingly, it is possible to generate a driving model that shows change of the vehicle behavior necessary for shifting the behavior of the vehicle 100 from a state at the start of specific driving operation to a state at the end thereof in movement time given until the state quantity of the vehicle 100 is shifted to a target state quantity. Thereby, generated is a driving model that shows change of the vehicle behavior to be used as a reference, when a certain movement time is given. Then, it is possible to generate a driving model that is to be used as a reference in a situation where only limited movement time is allowed.

DESCRIPTION OF THE REFERENCE NUMERALS

100 ... vehicle, 110 ... vehicle state detector, 111 ... vehicle speed sensor, 112 ... acceleration sensor, 113 ... gyro sensor, 114 ... accelerator sensor, 115 ... brake sensor, 116 ... steering angle sensor, 120 ... operation information recorder, 130 ... target action extractor, 140, 140B ... driving model generation device, 141 ... traveling distance calculator, 142 ... model generator, 143, 143A ... gradual change processor, 144 ... driver characteristics reflecting unit, 145 ... gradual change setting unit, 146 ... input device, 147 ... driving model database, 148 ... vehicle actions recorder, 149 ... vehicle behavior averaging unit, 150, 150A, 150B ... driving support system, 151 ... driving evaluator, 152, 152A ... driving support unit, 152b ... model extractor, 153 ... sound device of vehicle, 154 ... display device of vehicle, 155 ... situation estimation unit, 156 ... road map data, 157 ... remaining movement distance computing unit, 158 ... support controller, 158a ... engine control device, 158b ... brake control device, 158c ... steering control device, 160 ... traveling environment detector, 161 ... on-board communication device, 162 ... GPS, 170 ... on-board communication device, 200 ... management center, 210 ... central communications equipment, 220 ... driving model generation device of management center, 221 ... traveling distance calculator of management center, 222 ... model generator of management center, 223 ... gradual change processor of management center, 230 ... driving evaluation device of management center, 300 ... information terminal, 301 ... terminal communication device, 302 ... driving support unit of information terminal, 303 ... sound device of information terminal, 304 ... display device of information terminal

The invention claimed is:

1. A driving model generation device configured to generate a driving model on the basis of a driving operation of a vehicle by a driver and to interface with a driving support system that supports driving operation of the vehicle by the driver, the driving model generation device comprising:
   a state quantity detector sensor configured to detect a vehicle state quantity that changes according to the driving operation by the driver; and
   a model generator circuit configured to, on the basis of the vehicle state quantity when the driver starts a specific driving operation and the vehicle state quantity when the driver ends the specific driving operation, generate the driving model to be used as a reference related to the specific driving operation, wherein
   the vehicle state quantity includes a movement distance or a movement time of the vehicle from the start of the specific driving operation to the end thereof and an amount of change in vehicle behavior from the start of the driving operation to the end thereof, the model generator circuit is configured to generate a simple model that shows changes over time in vehicle behavior from the start of the specific driving operation to the end thereof, the driving model generation device further includes a gradual change processor circuit configured to carry out gradual change processing, which is processing for decreasing a degree of change in vehicle behavior per unit time or per unit distance shown by the previously generated simple model to generate the driving model by incorporating a time constant into the simple model, the gradual change processor circuit is configured to carry out, as the gradual change processing, processing for decreasing the degree of change in vehicle behavior in a zone of a specific percentage that includes a change in the vehicle behavior in an entire zone where the specific driving operation has been performed, the gradual change processor circuit is configured to modify the degree of change in vehicle behavior of the simple model according to whether the entire zone is long or short, the gradual change processor circuit is configured to change the simple model in a manner in which the vehicle behavior will change over a longer zone when the entire zone is long and change the simple model in a manner in which the vehicle behavior will change over a shorter zone when the entire zone is short, the gradual change processor circuit is configured to change the simple model to the driving model such that the amount of change in vehicle behavior from the start of the specific driving operation to the end thereof is increased on a basis of a constant rate of change, then the amount of change is kept constant, and then the amount of change is decreased on the basis of the constant rate of change, the specific driving operation is one slowing down operation, one speeding up operation, or one braking operation, the start of the specific driving operation corresponds to a beginning of the entire zone, the end of the specific driving operation corresponds to an end of the entire zone, the driving support system comprises a driving support circuit configured to guide driving operation of the vehicle by an evaluation-target driver into a driving operation in compliance with the driving model using a vehicle driving system mounted on the vehicle providing vehicle control guidance, and the driving support system supports the driving operation of the vehicle based on a comparison of the driving model generated by the model generator circuit and the vehicle state quantity detected by the state quantity detector sensor.

2. The driving model generation device according to claim 1, wherein the gradual change processor circuit is configured to carry out at least one of the following processing as the gradual change processing:

b) processing for decreasing the degree of change in vehicle behavior in a specific zone that includes at least one of the start point and the end point of the zone, in the entire zone where specific driving operation has been performed;

c) processing for decreasing the degree of change in vehicle behavior in a zone where a vehicle has traveled during lapse of a predetermined period of time after the vehicle has gone through the start point of the zone, in the entire zone where specific driving operation has been performed; and d) processing for decreasing the degree of change in vehicle behavior in a zone where a vehicle has traveled during a predetermined period of time until the vehicle arrives at the end point of the zone, in the entire zone where specific driving operation has been performed.

3. The driving model generation device according to claim 1, wherein the gradual change processor circuit is configured to modify a decreasing rate of the degree of change in the vehicle behavior according to a driving pattern of a driver to whom the driving model is to be presented.

4. The driving model generation device according to claim 1, wherein the state quantity detector sensor is configured to obtain information that shows state quantities of a plurality of vehicles on the basis of driving operations by a plurality of drivers as the vehicle state quantity, and the gradual change processor circuit is configured to use, as an amount of change in vehicle behavior at which the gradual change processing is carried out, at least one of the following:

11) an average value of amounts of change in vehicle behavior by a same driver;

12) an average value of amounts of change in vehicle behavior on the basis of the driving operations by the plurality of drivers obtained at a specific site; and 13) an average value of amounts of change in vehicle behavior on the basis of driving operations by a same driver obtained at a specific site.

5. The driving model generation device according to claim 1, wherein an amount of change in vehicle behavior is composed of at least one of traveling velocity, deceleration, acceleration, jerk, and turning angle of the vehicle, and the model generator circuit is configured to generate a driving model of at least one of driving operation selected from a slowing down operation at a time of slowing down of the vehicle;

a speeding up operation at a time of speeding up of the vehicle; and turning operation at a time of traveling on a curve or at a time of traveling on a street crossing.

6. The driving model generation device according to claim 1, wherein the model generator circuit is configured to be installed at a management center at which information showing the vehicle state quantity is aggregated, and the model generator circuit is configured to generate the driving model on the basis of the information showing the vehicle state quantity aggregated at the management center.

7. The driving model generation device according to claim 1, wherein the driving support system includes at least one of a sound device that provides voice guidance and a display device that provides image guidance.

8. A driving support system, comprising:

a driving support circuit that supports driving of the vehicle by a driver; and a driving evaluation device configured to evaluate driving of a vehicle by a driver, the driving evaluation device comprising:
a driving evaluator circuit configured to evaluate driving skill of the vehicle by the driver; and
an evaluation component detector sensor configured to detect, as an evaluation component, a vehicle state quantity that changes according to a driving operation by an evaluation-target driver,
wherein the driving evaluator circuit is configured to compare a driving model generated by a driving model generation device with the vehicle state quantity detected by the evaluation component detector sensor, thereby evaluating the driving skill of the evaluation-target driver, the driving model generation device configured to generate the driving model on the basis of a driving operation of a vehicle by a driver, and the driving model generation device comprising:
a state quantity detector sensor configured to detect a vehicle state quantity that changes according to the driving operation by the driver; and
a model generator circuit configured to, on the basis of the vehicle state quantity when the driver starts a specific driving operation and the vehicle state quantity when the driver ends the specific driving operation, generate the driving model to be used as a reference related to the specific driving operation, wherein
the vehicle state quantity includes a movement distance or a movement time of the vehicle from the start of the specific driving operation to the end thereof and an amount of change in vehicle behavior from the start of the specific driving operation to the end thereof,
the model generator circuit is configured to generate a simple model that shows changes over time in vehicle behavior from the start of the driving operation to the end thereof,
the driving model generation device further includes a gradual change processor circuit configured to carry out gradual change processing, which is processing for decreasing a degree of change in vehicle behavior per unit time or per unit distance shown by the previously generated simple model to generate the driving model by incorporating a time constant into the simple model,
the gradual change processor circuit is configured to carry out, as the gradual change processing, processing for decreasing the degree of change in vehicle behavior in a zone of a specific percentage that includes a change in the vehicle behavior in an entire zone where the specific driving operation has been performed,
the gradual change processor circuit is configured to modify the degree of change in vehicle behavior of the simple model according to whether the entire zone is long or short,
the gradual change processor circuit is configured to change the simple model in a manner in which the vehicle behavior will change over a longer zone when the entire zone is long and change the simple model in a manner in which the vehicle behavior will change over a shorter zone accordingly when the entire zone is short,
the gradual change processor circuit is configured to change the simple model to the driving model such that the amount of change in vehicle behavior from the start of the specific driving operation to the end thereof is increased on a basis of a constant rate of change, then the amount of change is kept constant, and then the amount of change is decreased on the basis of the constant rate of change,
the specific driving operation is one slowing down operation, one speeding up operation, or one braking operation,
the start of the specific driving operation corresponds to a beginning of the entire zone,
the end of the specific driving operation corresponds to an end of the entire zone,
the driving support circuit is configured to guide driving operation of the vehicle by the evaluation-target driver into a driving operation in compliance with the driving model using a vehicle driving system mounted on the vehicle providing vehicle control guidance, and
the driving support system supports the driving operation of the vehicle based on the comparison of the driving model generated by the model generator circuit and the vehicle state quantity detected by the evaluation component detector sensor.

9. The driving support system according to claim 8, further comprising at least one of a sound device that provides voice guidance and a display device that provides image guidance.

10. A driving support system configured to support a driving operation by a driver of a vehicle, the system comprising:
a driving evaluation device configured to evaluate driving of the vehicle by the driver; and
a driving support circuit that supports driving of the vehicle by the driver on the basis of evaluation results made by the driving evaluation device, the driving evaluation device including:
a driving evaluator circuit configured to evaluate the driving operation of the vehicle by the driver;
an evaluation component detector sensor configured to detect, as an evaluation component, a vehicle state quantity that changes according to a driving operation by an evaluation-target driver, and
a driving model generation device configured to generate a driving model on the basis of the driving operation of the vehicle by the driver, wherein the driving evaluator circuit is configured to compare the driving model generated by the driving model generation device with the vehicle state quantity detected by the evaluation component detector sensor, thereby evaluating the driving skill of the evaluation-target driver, the driving model generation device comprising:
a state quantity detector sensor configured to detect a vehicle state quantity that changes according to the driving operation by the driver;
a model generator circuit configured to, on the basis of the vehicle state quantity when the driver starts a specific driving operation and the vehicle state quantity when the driver ends the specific driving operation, generate the driving model to be used as a reference related to the specific driving operation, wherein the vehicle state quantity includes a movement distance or a movement time of the vehicle from the start of the specific driving operation to the end thereof and an amount of change in vehicle behavior from the start of the specific driving operation to the end thereof, and the model generator circuit is configured to generate a simple model that shows changes over time in vehicle behavior from the start of the driving operation to the end thereof; and a gradual change processor circuit configured to:
carry out gradual change processing, which is processing for decreasing a degree of change in vehicle behavior per unit time or per unit distance shown by the previously generated simple model to generate the driving model by incorporating a time constant into the simple model,
carry out, as the gradual change processing, processing for decreasing the degree of change in vehicle behavior in a zone of a specific percentage that includes a change in the vehicle behavior in an entire zone where the specific driving operation has been performed,
modify the degree of change in vehicle behavior of the simple model according to whether the entire zone is long or short, and
change the simple model in a manner in which the vehicle behavior will change over a longer zone when the entire zone is long and change the simple model in a manner in which the vehicle behavior will change over a shorter zone accordingly when the entire zone is short, wherein the driving support circuit is configured to guide driving operation of the vehicle by the evaluation-target driver into a driving operation in co e driving model using a vehicle driving system mounted on the vehicle providing vehicle control guidance, the driving support system supports the driving operation of the vehicle based on the comparison of the driving model generated by the driving model generation device and the vehicle state quantity detected by the evaluation component detector sensor, the gradual change processor circuit is configured to change the simple model to the driving model such that the amount of change in vehicle behavior from the start of the specific driving operation to the end thereof is increased on a basis of a constant rate of change, then the amount of change is kept constant, and then the amount of change is decreased on the basis of the constant rate of change, the specific driving operation is one slowing down operation, one speeding up operation, or one braking operation, the start of the specific driving operation corresponds to a beginning of the entire zone, and the end of the specific driving operation corresponds to an end of the entire zone.

11. The driving support system according to claim 10, further comprising at least one of a sound device that provides voice guidance and a display device that provides image guidance.

12. A driving model generation method for generating a driving model performed by a driving model generation device on the basis of a driving operation of a vehicle by a driver, the driving model generation device configured to interface with a driving support system that supports driving operation of the vehicle by the driver, the driving model generation method comprising:

detecting a vehicle state quantity that changes according to the driving operation by the driver by a state quantity detector sensor;

generating the driving model to be used as a reference related to specific driving operation on the basis of the vehicle state quantity when the driver starts the specific driving operation and the vehicle state quantity when the driver ends the specific driving operation by a model generator circuit;

selecting, as the vehicle state quantity, a movement distance or a movement time of a vehicle from the start of the specific driving operation to the end thereof and an amount of change in vehicle behavior from the start of the specific driving operation to the end thereof;

generating a simple model that shows change over time in vehicle behavior from the start of the specific driving operation to the end thereof; and carrying out a gradual change, which is processing for decreasing the degree of change in vehicle behavior per unit time or per unit distance shown by the simple model generated on the basis of generation of the simple model to generate the driving model by incorporating a time constant into the simple model by a gradual change processor circuit, the gradual change including:
decreasing the degree of change in vehicle behavior in a zone of a specific percentage that includes a change in the vehicle behavior in an entire zone where the specific driving operation has been performed,
modifying the degree of change in vehicle behavior of the simple model according to whether the entire zone is long or short,
changing the simple model in a manner in which the vehicle behavior will change over a longer zone when the entire zone is long and changing the simple model in a manner in which the vehicle behavior will change over a shorter zone accordingly when the entire zone is short, and
changing the simple model to the driving model such that the amount of change in vehicle behavior from the start of the specific driving operation to the end thereof is increased on a basis of a constant rate of change, then the amount of change is kept constant, and then the amount of change is decreased on the basis of the constant rate of change, wherein the specific driving operation is one slowing down operation, one speeding up operation, or one braking operation, the start of the specific driving operation corresponds to a beginning of the entire zone, the end of the specific driving operation corresponds to an end of the entire zone, the driving support system comprises a driving support circuit configured to guide driving operation of the vehicle by an evaluation-target driver into a driving operation in compliance with the driving model using a vehicle driving system mounted on the vehicle providing vehicle control guidance, and the driving support system supports the driving operation of the vehicle based on a comparison of the driving model generated by the driving model generation device and the vehicle state quantity detected by the state quantity detector sensor.

13. The generation method according to claim 12, wherein the gradual change carries out at least one of the following:

b) decreasing the degree of change in vehicle behavior in a specific zone that includes at least one of the start point and the end point of the zone, in the entire zone where specific driving operation has been performed;

c) decreasing the degree of change in vehicle behavior in a zone where a vehicle has traveled during lapse of a predetermined period of time after the vehicle has gone through the start point of the zone, in the entire zone where specific driving operation has been performed; and d) decreasing the degree of change in vehicle behavior in a zone where a vehicle has traveled during a predetermined period of time until the vehicle arrives at the end point of the zone, in the entire zone where specific driving operation has been performed.

14. The generation method according to claim 12, wherein
the gradual change includes modifying a decreasing rate of the degree of change in the vehicle behavior according to a driving pattern of a driver to whom a driving model generated by generation of the driving model is to be presented.

15. The generation method according to claim 12, wherein
the detection of the vehicle state quantity includes obtaining information that shows state quantifies of a plurality of vehicles on the basis of driving operations by a plurality of drivers as the vehicle state quantity, and
the gradual change uses, as an amount of change in a vehicle in which the gradual change is carried out, at least one of the following:
11) average value of amounts of change in vehicle behavior by a same driver;
12) an average value of amounts of change in vehicle behavior on the basis of the driving operations by the plurality of drivers obtained at a specific site; and
13) an average value of amounts of change in vehicle behavior on the basis of driving operations by a same driver obtained at a specific site.

16. The generation method according to claim 12, further comprising selecting at least one of traveling velocity, deceleration, acceleration, jerk, and turning angle of a vehicle as an amount of change in vehicle behavior, wherein
generation of the driving model includes generating a driving model of at least one of driving operation selected from
a slowing down operation at a time of slowing down of the vehicle,
a speeding up operation at a time of speeding up of the vehicle, and
turning operation at a time of traveling on a curve or at a time of traveling on a street crossing.

17. The generation method according to claim 12, wherein the driving support system includes at least one of a sound device that provides voice guidance and a display device that provides image guidance.

18. A driving support method, comprising:
providing driving support to a driver via a driving support circuit; and
a driving evaluation method performed by a driving evaluation device for evaluating driving of a vehicle by a driver, the driving evaluation method comprising:
evaluating driving operation the vehicle by the driver by a driving evaluator; and
detecting, as an evaluation component, a vehicle state quantity that changes according to a driving operation by an evaluation-target driver by an evaluation component detector;
wherein the evaluation of the driving operation includes comparing a driving model generated by a driving model generation method with the vehicle state quantity detected by evaluation of the driving operation, thereby evaluating the driving skill of the evaluation-target driver, and
wherein the driving model generation method generates the driving model on the basis of a driving operation of a vehicle by a driver, the driving model generation method comprising:
detecting a vehicle state quantity that changes according to the driving operation by the driver by a state quantity detector sensor;
generating the driving model to be used as a reference related to specific driving operation on the basis of the vehicle state quantity when the driver starts the specific driving operation and the vehicle state quantity when the driver ends the specific driving operation by a model generator circuit;
selecting, as the vehicle state quantity, a movement distance or a movement time of a vehicle from the start of the specific driving operation to the end thereof and an amount of change in vehicle behavior from the start of the specific driving operation to the end thereof;
generating a simple model that shows change over time in vehicle behavior from the start of the specific driving operation to the end thereof, and
carrying out a gradual change, which is processing for decreasing the degree of change in vehicle behavior per unit time or per unit distance shown by the simple model generated on the basis of generation of the simple model to generate the driving model by incorporating a time constant into the simple model by a model generator circuit,
the gradual change including:
decreasing the degree of change in vehicle behavior in a zone of a specific percentage that includes a change in the vehicle behavior in an entire zone where specific driving operation has been performed,
modifying the degree of change in vehicle behavior of the simple model according to whether the entire zone is long or short,
changing the simple model in a manner in which the vehicle behavior will change over a longer zone when the entire zone is long and changing the simple model in a manner in which the vehicle behavior will change over a shorter zone accordingly when the entire zone is short, and
changing the simple model to the driving model such that the amount of change in vehicle behavior from the start of the specific driving operation to the end thereof is increased on a basis of a constant rate of change, then the amount of change is kept constant, and then the amount of change is decreased on the basis of the constant rate of change, and wherein the specific driving operation is one slowing down operation, one speeding up operation, or one braking operation,
the start of the specific driving operation corresponds to a beginning of the entire zone,
the end of the specific driving operation corresponds to an end of the entire zone,
the driving support circuit is configured to guide driving operation of the vehicle by the evaluation-target driver into a driving operation in compliance with the driving model using a vehicle driving system mounted on the vehicle providing vehicle control guidance, and the driving support provided by the driving support circuit is based on the comparison of the driving model generated by the driving model generation method and the vehicle state quantity detected by evaluation of the driving operation.

19. The driving support method according to claim 18, wherein the driving support circuit controls at least one of a sound device that provides voice guidance and a display device that provides image guidance.

* * * * *